(12) United States Patent
Chen et al.

(10) Patent No.: US 12,412,802 B2
(45) Date of Patent: Sep. 9, 2025

(54) HEAT DISSIPATION STRUCTURES FOR INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Chih-Hao Chen, Taipei (TW); Po-Yuan Cheng, New Taipei (TW); Pu Wang, Hsinchu (TW); Li-Hui Cheng, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 579 days.

(21) Appl. No.: 17/686,856

(22) Filed: Mar. 4, 2022

(65) Prior Publication Data
US 2023/0014913 A1  Jan. 19, 2023

Related U.S. Application Data

(60) Provisional application No. 63/222,021, filed on Jul. 15, 2021.

(51) Int. Cl.
*H01L 23/367* (2006.01)
*H01L 21/48* (2006.01)
(Continued)

(52) U.S. Cl.
CPC ...... *H01L 23/3675* (2013.01); *H01L 21/4871* (2013.01); *H01L 21/6836* (2013.01);
(Continued)

(58) Field of Classification Search
CPC ............ H01L 23/3675; H01L 21/4871; H01L 21/6836; H01L 23/3736; H01L 23/5383;
(Continued)

(56) References Cited

U.S. PATENT DOCUMENTS 9,000,584 B2  4/2015 Lin et al.
9,048,222 B2  6/2015 Hung et al.
(Continued)

FOREIGN PATENT DOCUMENTS

CN  105702664 A  6/2016
CN  108206178 A  6/2018
(Continued)

*Primary Examiner* — Fernando L Toledo
*Assistant Examiner* — Neil R Prasad
(74) *Attorney, Agent, or Firm* — Slater Matsil, LLP

(57) ABSTRACT

In an embodiment, a device includes: a package component including an integrated circuit die and conductive connectors connected to the integrated circuit die, the conductive connectors disposed at a front-side of the package component, the integrated circuit die exposed at a back-side of the package component; a heat dissipation layer on the back-side of the package component and on sidewalls of the package component; an adhesive layer on a back-side of the heat dissipation layer, a portion of a sidewall of the heat dissipation layer being free from the adhesive layer; and a package substrate connected to the conductive connectors.

20 Claims, 34 Drawing Sheets

(51) Int. Cl.
  *H01L 21/683* (2006.01)
  *H01L 23/00* (2006.01)
  *H01L 23/373* (2006.01)
  *H01L 23/538* (2006.01)

(52) U.S. Cl.
  CPC ...... *H01L 23/3736* (2013.01); *H01L 23/5383* (2013.01); *H01L 23/5386* (2013.01); *H01L 23/5389* (2013.01); *H01L 24/20* (2013.01); H01L 2221/68354 (2013.01); H01L 2224/214 (2013.01)

(58) Field of Classification Search
  CPC . H01L 23/5386; H01L 23/5389; H01L 24/20; H01L 2221/68354; H01L 2224/214
  See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,761,566 B1 | 9/2017 | Yu et al. | |
| 2008/0265383 A1 | 10/2008 | Brunnbauer et al. | |
| 2015/0108628 A1* | 4/2015 | Yu | H01L 23/3675 257/712 |
| 2015/0235936 A1* | 8/2015 | Yu | H01L 23/36 257/737 |
| 2017/0025582 A1* | 1/2017 | Dai | H01L 33/505 |
| 2017/0200711 A1* | 7/2017 | Uzoh | H01L 24/75 |
| 2018/0175011 A1 | 6/2018 | Sung et al. | |
| 2019/0348371 A1* | 11/2019 | Fang | H01L 23/552 |
| 2020/0135710 A1 | 4/2020 | Kim et al. | |
| 2021/0082894 A1 | 3/2021 | Chen et al. | |
| 2021/0118812 A1 | 4/2021 | Liu et al. | |
| 2022/0230967 A1* | 7/2022 | Park | H01L 24/19 |

FOREIGN PATENT DOCUMENTS

| | | |
|---|---|---|
| CN | 111092074 A | 5/2020 |
| TW | 202113995 A | 4/2021 |

* cited by examiner

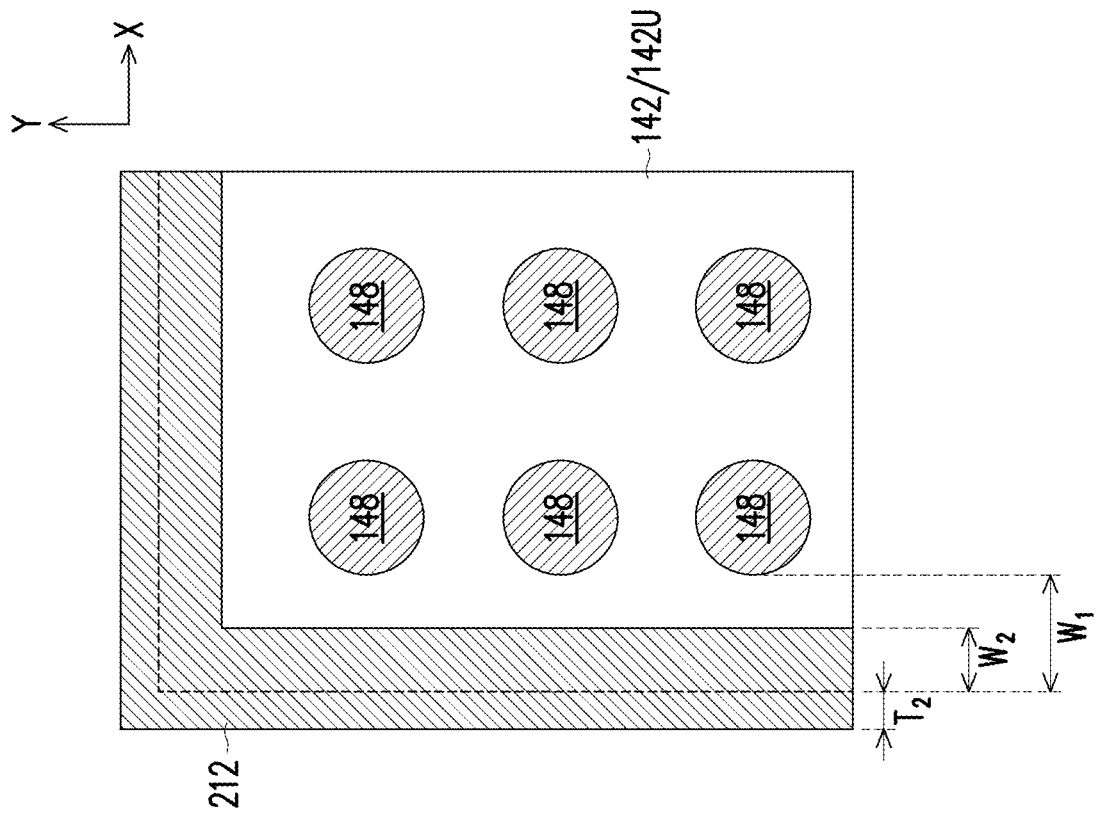
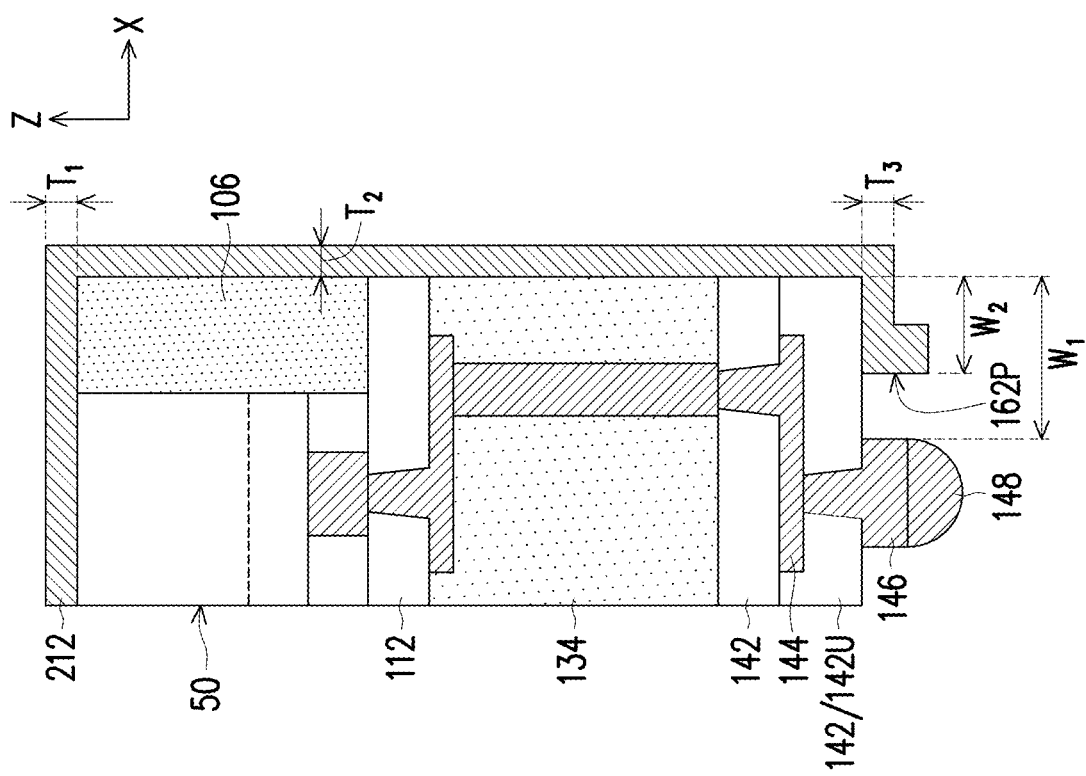
FIG. 13A
FIG. 13B

US 12,412,802 B2

HEAT DISSIPATION STRUCTURES FOR INTEGRATED CIRCUIT PACKAGES AND METHODS OF FORMING THE SAME

PRIORITY CLAIM AND CROSS-REFERENCE

This application claims the benefit of U.S. Provisional Application No. 63/222,021, filed on Jul. 15, 2021, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-15 are views of intermediate stages in the manufacturing of integrated circuit packages, in accordance with some embodiments.

DETAILED DESCRIPTION

Figure 1:
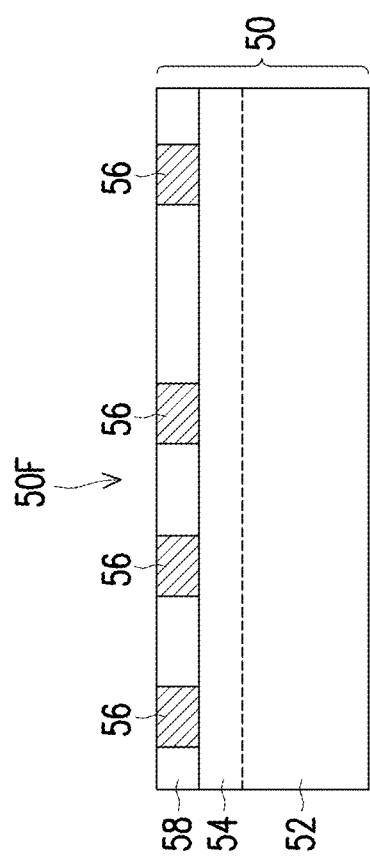
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, integrated circuit packages are formed by packaging integrated circuit dies in a wafer. The wafer is singulated to form intermediate package components. After the package components are singulated, heat dissipation structures are formed around at least three sides of the package components. The package components and the heat dissipation structures are then attached to package substrates to form the integrated circuit packages. Forming the heat dissipation structures after the package components are singulated advantageously allows the heat dissipation structures to be formed on the back-side surfaces, the sidewalls, and (optionally) the front-side surfaces of the package components. The heat dissipation structures may thus have a large surface area, improving heat dissipation in the integrated circuit packages.

FIG. 1 is a cross-sectional view of an integrated circuit die 50. Integrated circuit dies 50 will be packaged in subsequent processing to form integrated circuit packages. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layers may include conductive vias and/or conductive lines to interconnect the devices of the semiconductor substrate 52. The metallization layers may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front-side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

A dielectric layer 58 is at the front-side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 are exposed through the dielectric layer 58 during formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are substantially coplanar (within process variations) such that they are level with one another. The die connectors 56 and the dielectric layer 58 are exposed at the front-side 50F of the integrated circuit die 50.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias. Each of the semiconductor substrates 52 may (or may not) have a separate interconnect structure 54.

FIGS. 2-15 are views of intermediate stages in the manufacturing of integrated circuit packages 200, in accordance with some embodiments. FIGS. 2-12 and 14-15 are cross-sectional views of a process for forming package components 210 which include redistribution structures for forming out electrical connections, such as Integrated Fan-Out (InFO) package components. In the illustrated embodiments, the InFO package components include two layers of encapsulated dies. In other embodiments, the InFO package components have other quantities of layers, such as one layer or more than two layers.

The integrated circuit packages 200 (see FIG. 15) will be formed by initially packaging integrated circuit dies 50 to form package components 210 in a wafer 100. Two package regions 100A, 100B of the wafer 100 are illustrated, and integrated circuit dies 50 are packaged to form a package component 210 in each of the package regions 100A, 100B of the wafer 100. It should be appreciated that any quantity of package regions can be simultaneously processed to form any quantity of package components. The package regions 100A, 100B of the wafer 100 will be singulated to form the package components 210. Heat dissipation structures 212 will then be formed around the package components 210. The package components 210 will then be attached to package substrates 220 (see FIG. 14) to complete formation of the integrated circuit packages 200.

Figure 2:
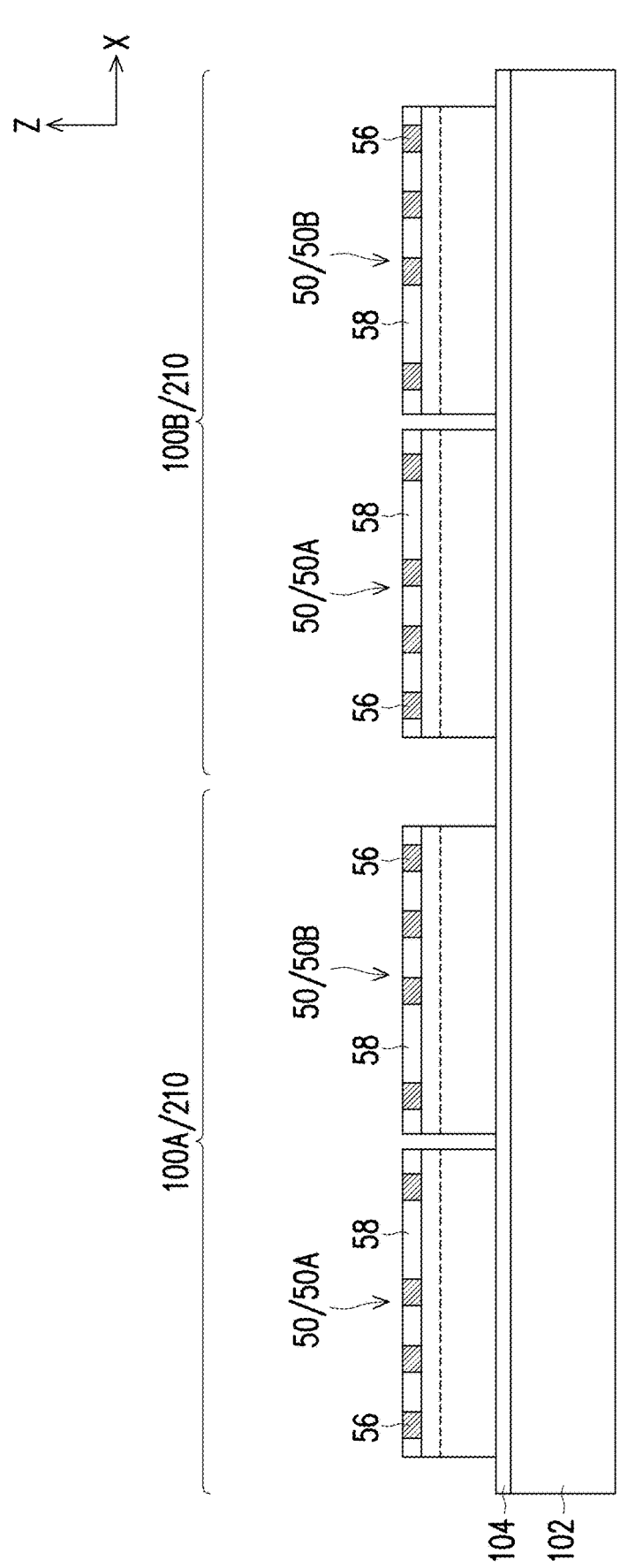

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be planarized and may have a high degree of planarity.

Semiconductor dies such as integrated circuit dies 50 are placed on the release layer 104. A desired type and quantity of the integrated circuit dies 50 are placed in each of the package regions 100A, 100B of the wafer 100. The integrated circuit dies 50 may be placed by, e.g., a pick-and-place process. In the illustrated embodiment, multiple integrated circuit dies 50 (including a first integrated circuit die 50A and a second integrated circuit die 50B) are placed adjacent one another in each of the package regions 100A, 100B of the wafer 100. In some embodiments, the first integrated circuit dies 50A are logic devices, such as CPUs, GPUs, or the like, and the second integrated circuit dies 50B are memory devices, such as DRAM dies, HMC modules, HBM modules, or the like. In some embodiments, the first integrated circuit dies 50A are the same type of devices (e.g., SoCs) as the second integrated circuit dies 50B. The first integrated circuit dies 50A may be formed in a process of a same technology node as the second integrated circuit dies 50B, or may be formed in a process of a different technology node than the second integrated circuit dies 50B. For example, the first integrated circuit dies 50A may be of a more advanced process node than the second integrated circuit dies 50B. The first integrated circuit dies 50A may have a different size (e.g., different height and/or surface area) than the second integrated circuit dies 50B, or may have the same size (e.g., same heights and/or surface areas) as the second integrated circuit dies 50B.

Figure 3:
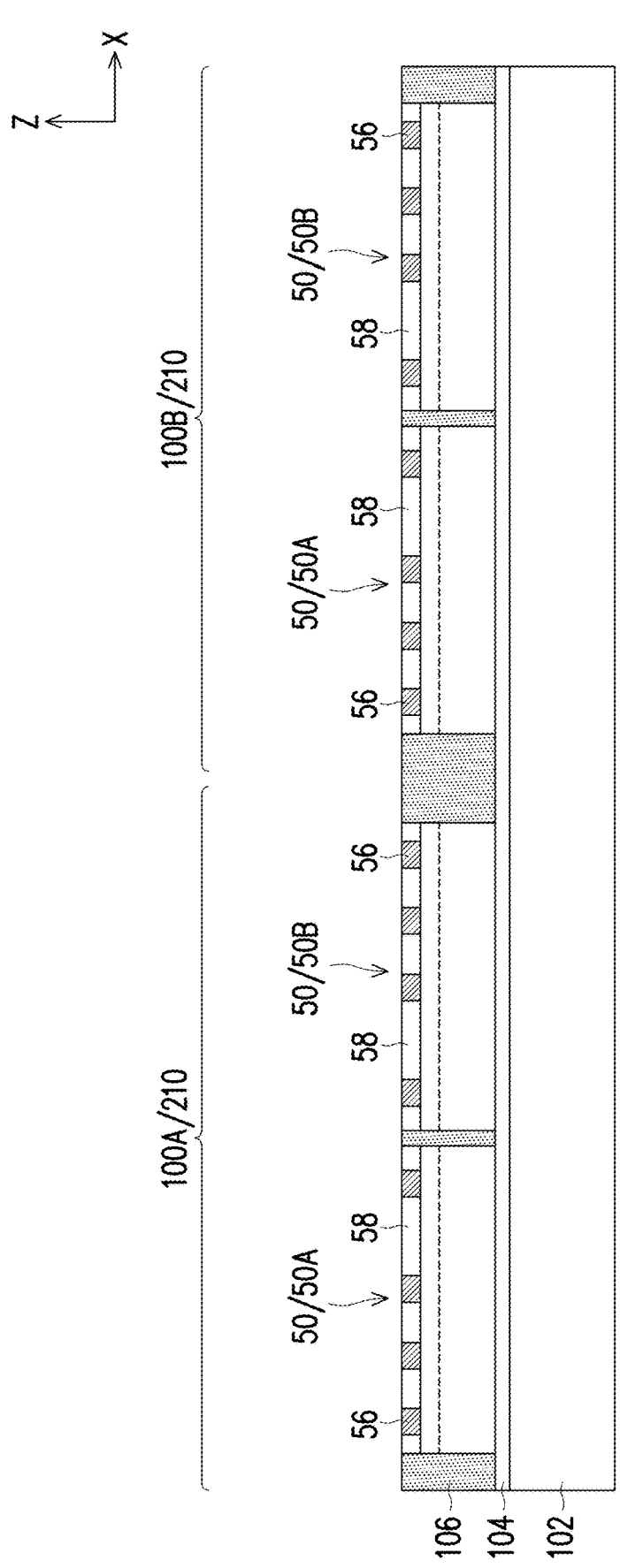

In FIG. 3, an encapsulant 106 is formed around the integrated circuit dies 50 and on the release layer 104. After formation, the encapsulant 106 encapsulates the integrated circuit dies 50. The encapsulant 106 may be a molding compound, epoxy, or the like. In some embodiments, the encapsulant 106 includes a polymer resin having fillers disposed therein. The encapsulant 106 may be applied by compression molding, transfer molding, or the like, and may be dispensed over the carrier substrate 102 such that the integrated circuit dies 50 are buried or covered. The encapsulant 106 is further dispensed in gap regions between the integrated circuit dies 50. The encapsulant 106 may be applied in liquid or semi-liquid form and then subsequently cured. A planarization process may be performed on the encapsulant 106 to expose the die connectors 56 of the integrated circuit dies 50. The planarization process may remove material of the encapsulant 106 and the integrated circuit dies 50 (e.g., the die connectors 56 and the dielectric layer 58) until the die connectors 56 are exposed. After the planarization process, top surfaces of the encapsulant 106 and the integrated circuit dies 50 (e.g., the die connectors 56 and the dielectric layer 58) are substantially coplanar (within process variations) such that they are level with one another. The planarization process may be, for example, a chemical-mechanical polish (CMP), a grinding process, or the like. In some embodiments, the planarization process may be omitted, for example, if the die connectors 56 are already exposed.

Figure 4:
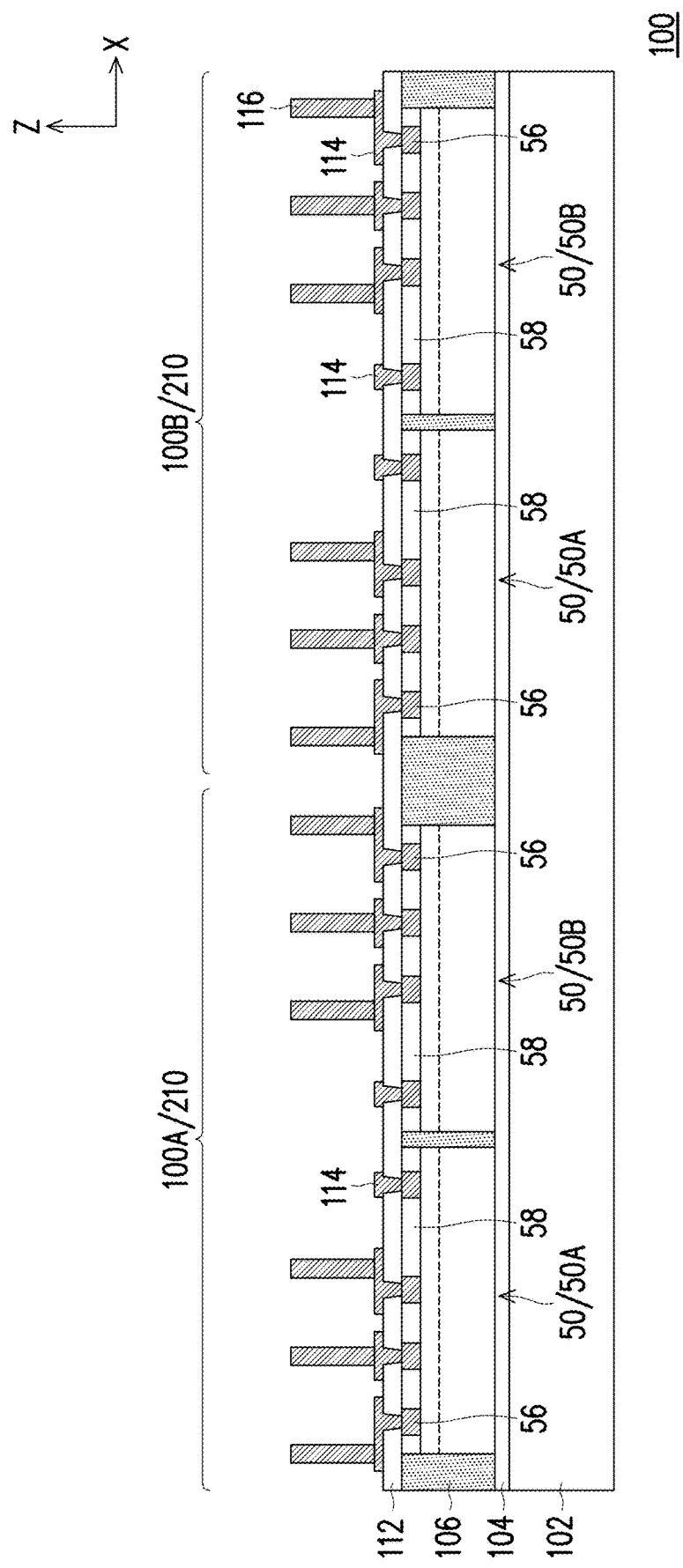

In FIG. 4, a dielectric layer 112 is deposited on the encapsulant 106 and the integrated circuit dies 50 (e.g., on the die connectors 56 and the dielectric layer 58). The dielectric layer 112 may be formed of a photosensitive material which may be patterned using a lithography mask, such as PBO, polyimide, a BCB-based polymer, a cyclic olefin copolymer, an acryl-based copolymer, or the like, which may be formed by spin coating, lamination, CVD, or the like. Other acceptable dielectric materials formed by any acceptable process may be used. The dielectric layer 112 is then patterned. The patterning forms openings (not separately illustrated) in the dielectric layer 112 exposing portions of the die connectors 56. The patterning may be performed by any acceptable process, such as by exposing the dielectric layer 112 to light and developing it when the dielectric layer 112 is a photosensitive material, or by etching using, for example, an anisotropic etch.

Under-bump metallurgy layers (UBMLs) 114 are then formed. The UBMLs 114 have line portions on and extending along the top surface of the dielectric layer 112, and have via portions extending through the dielectric layer 112 to physically and electrically couple the UBMLs 114 to the die connectors 56 of the integrated circuit dies 50. As an example to form the UBMLs 114, a seed layer is formed over the dielectric layer 112 and in the openings through the dielectric layer 112. In some embodiments, the seed layer is a metal layer, which may be a single layer or a composite layer comprising a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMLs 114. The patterning forms openings through the photoresist to expose the seed layer. A conductive material is then formed in the openings of the photoresist and on the exposed portions of the seed layer. The conductive material may be a metal such as copper, titanium, tungsten, aluminum, or the like, which may be formed by plating, such as electroless plating or electroplating from the seed layer, or the like. The photoresist may be removed by any acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and the conductive material form the UBMLs 114.

Through vias 116 are formed on the line portions of the UBMLs 114, with some of the UBMLs 114 remaining free of the through vias 116. The through vias 116 and the UBMLs 114 will be used for connection to upper layers of the package components 210. In some embodiments, the through vias 116 are formed of the same conductive material as the UBMLs 114, such that the through vias 116 and the UBMLs 114 comprise the same continuous conductive material. As an example to form the through vias 116, a photoresist is formed and patterned on the UBMLs 114. The photoresist may be formed by spin coating or the like and may be exposed to light for patterning. The pattern of the photoresist corresponds to the through vias 116. A conductive material is then formed in the openings of the photoresist. In some embodiments, additional portions of the conductive material of the UBMLs 114 are formed in the openings of the photoresist. The additional portions of the conductive material of the UBMLs 114 may be formed by plating, such as electroless plating or electroplating from the original portions of the conductive material that were plated from the seed layer of the UBMLs 114, or the like. In some embodiments, no seed layers are formed between the conductive material of the UBMLs 114 and the through vias 116, so that the conductive material is a single continuous material layer. The photoresist is then removed. The photoresist may be removed by any acceptable ashing or stripping process, such as using an oxygen plasma or the like. The remaining portions of the conductive material forms the through vias 116.

Figure 5:
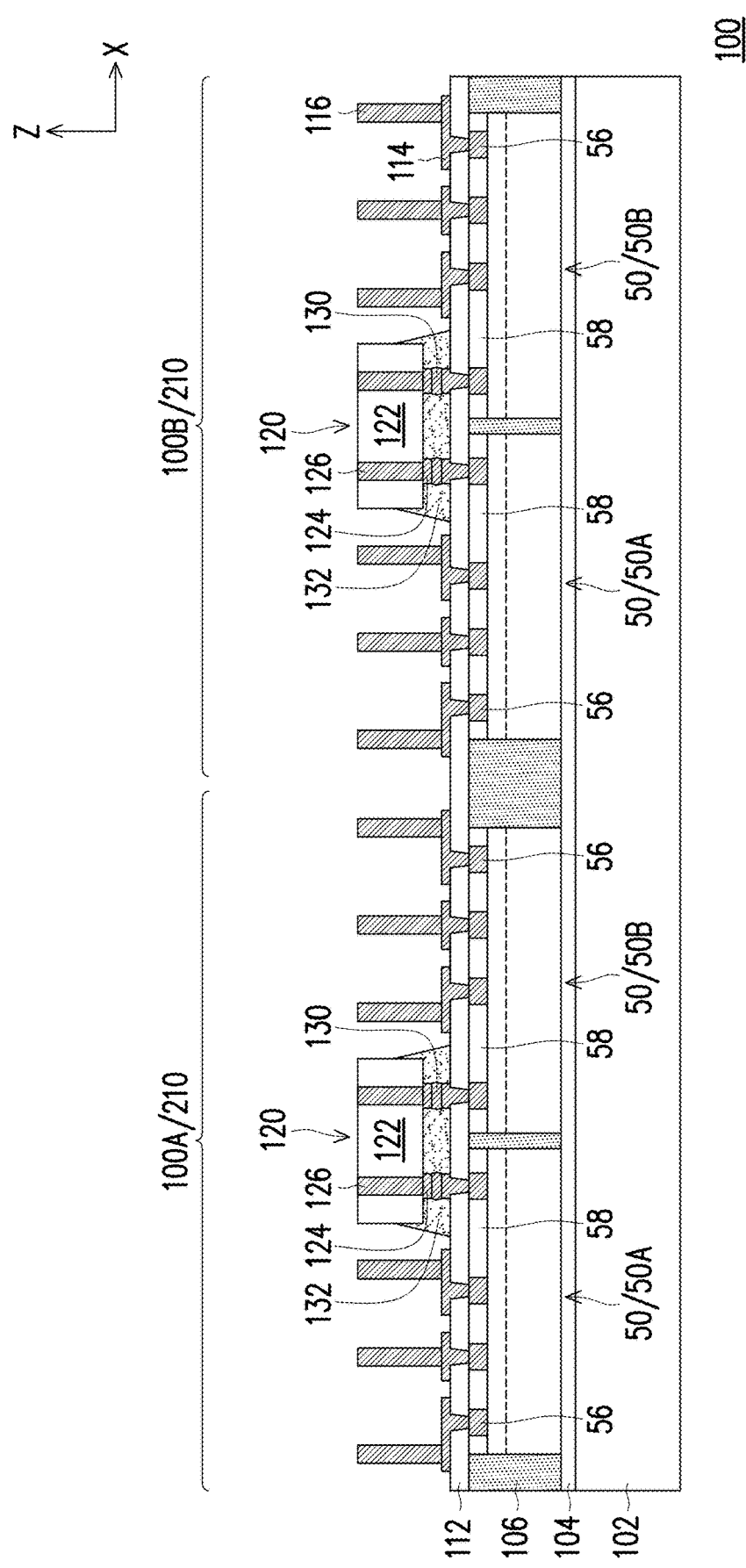

In FIG. 5, semiconductor dies such as interconnection dies 120 are attached to the UBMLs 114. A desired type and quantity of the interconnection dies 120 are placed in each of the package regions 100A, 100B of the wafer 100. The interconnection dies 120 may be local silicon interconnects (LSIs), large scale integration packages, interposer dies, or the like. Each interconnection die 120 includes a substrate 122, with conductive features formed in and/or on the substrate 122. The substrates 122 may be semiconductor substrates, dielectric layers, or the like. The interconnection dies 120 are connected to the UBMLs 114 using die connectors 124 disposed at the front-side of the interconnection dies 120. Some of the die connectors 124 may be electrically coupled to the back-side of the interconnection dies 120 with through-substrate vias (TSVs) 126 that extend into or through the substrates 122. In the illustrated embodiment, the TSVs 126 extend through the substrates 122 so that they are exposed at the back-sides of the interconnection dies 120. In another embodiment, a material of the substrates 122 (e.g., a dielectric material or semiconductor material) may be covering the TSVs 126. In some embodiments, passive devices (e.g., integrated passive devices) and/or other integrated circuit dies are attached to the UBMLs 114 in addition to or in lieu of the interconnection dies 120.

In some embodiments where the interconnection dies 120 are LSIs, the interconnection dies 120 may be bridge structures that include die bridges (not separately illustrated). The die bridges may be metallization layers formed in and/or on the substrates 122, and work to interconnect some of the die connectors 124 to one another. As such, the LSIs can be used to directly connect and allow communication between the integrated circuit dies 50 in each package region 100A, 100B of the wafer 100. In such embodiments, each interconnection die 120 can be placed over a region that is disposed between the underlying integrated circuit dies 50 so that the interconnection die 120 overlaps the underlying integrated circuit dies 50. In some embodiments, the interconnection dies 120 may further include logic devices and/or memory devices.

Conductive connectors 130 are formed on the die connectors 124 and/or some of the UBMLs 114. The conductive connectors 130 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 130 may include a conductive material such as solder, copper, aluminum, gold, nickel, silver, palladium, tin, the like, or a combination thereof. In some embodiments, the conductive connectors 130 are formed by initially forming a layer of solder on the die connectors 124 and/or the UBMLs 114 through evaporation, electroplating, printing, solder transfer, ball placement, or the like. Once a layer of solder has been formed on the structure, a reflow may be performed in order to shape the material into the desired bump shapes. The interconnection dies 120 are connected to the UBMLs 114 using the conductive connectors 130. Connecting the interconnection dies 120 may include placing the interconnection dies 120 on the UBMLs 114, and reflowing the conductive connectors 130 to physically and electrically couple the die connectors 124 to the underlying UBMLs 114.

In some embodiments, an underfill 132 is formed around the conductive connectors 130, and between the dielectric layer 112 and the interconnection dies 120. The underfill 132 may reduce stress and protect the joints resulting from the reflowing of the conductive connectors 130. The underfill 132 may also be included to adhere the interconnection dies 120 to the dielectric layer 112 and provide structural support and environmental protection. The underfill 132 may be formed of a molding compound, an epoxy, or the like. The underfill 132 may be formed by a capillary flow process after the interconnection dies 120 are attached, or may be formed by any suitable deposition method before the interconnection dies 120 are attached. The underfill 132 may be applied in liquid or semi-liquid form and then subsequently cured.

Figure 6:
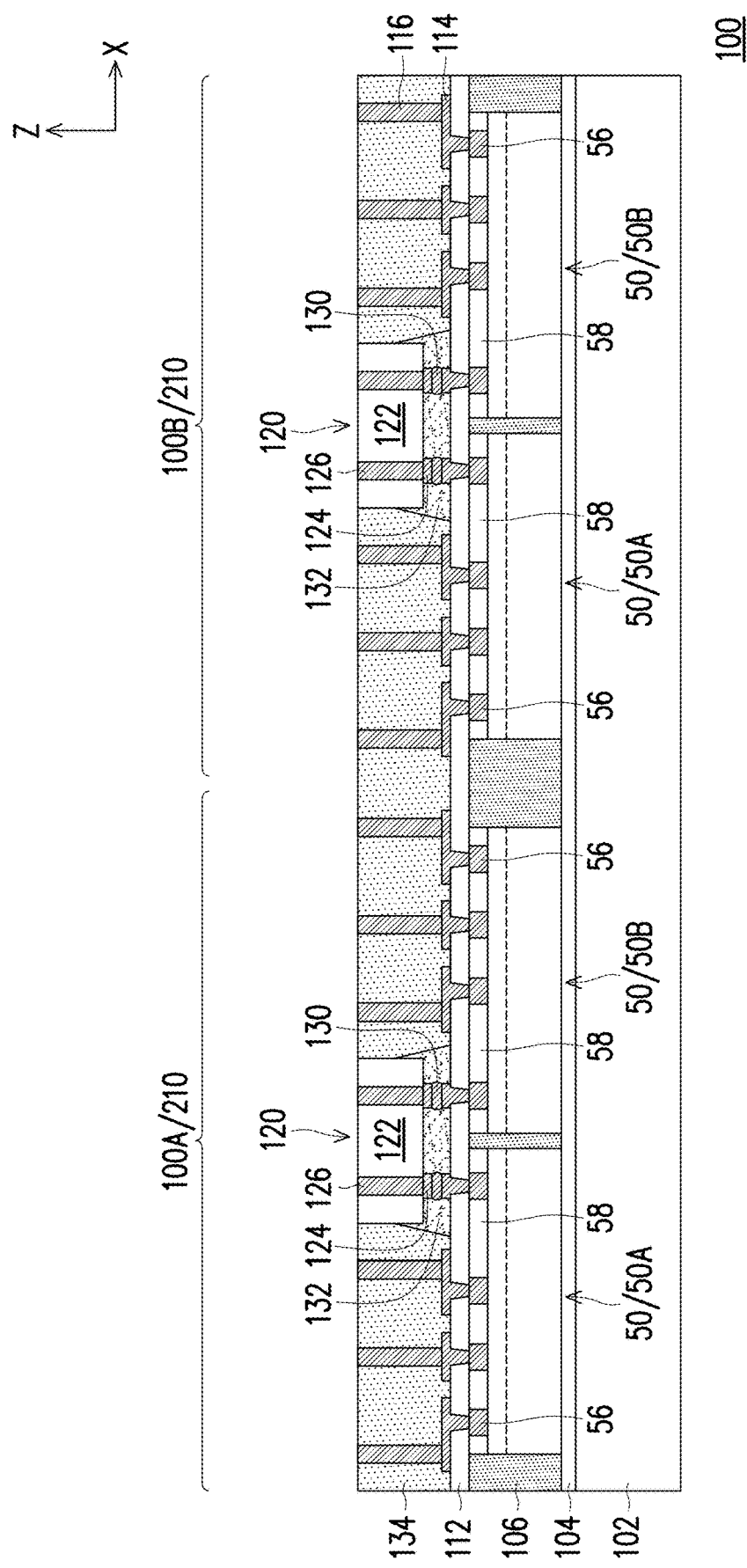

In FIG. 6, an encapsulant 134 is formed around the UBMLs 114, the through vias 116, the interconnection dies 120, and the underfill 132 (if present) or the conductive connectors 130. After formation, the encapsulant 134 encapsulates the UBMLs 114, the through vias 116, the interconnection dies 120, and the underfill 132 (if present) or the conductive connectors 130. The encapsulant 134 may be a molding compound, epoxy, or the like. In some embodiments, the encapsulant 134 includes a polymer resin having fillers disposed therein. The encapsulant 134 may be applied by compression molding, transfer molding, or the like, and may be dispensed such that the interconnection dies 120 and the through vias 116 are buried or covered. The encapsulant 134 is further dispensed in gap regions between the interconnection dies 120 and the through vias 116. The encapsulant 134 may be applied in liquid or semi-liquid form and then subsequently cured. A planarization process may be performed on the encapsulant 134 to expose the TSVs 126 and the through vias 116. The planarization process may remove material of the encapsulant 134, the TSVs 126, the substrates 122, and the through vias 116 until the TSVs 126 and the through vias 116 are exposed. After the planarization process, top surfaces of the encapsulant 134, the TSVs 126, the substrates 122, and the through vias 116 are substantially coplanar (within process variations) such that they are level with one another. The planarization process may be, for example, a chemical-mechanical polish (CMP), a grinding process, or the like. In some embodiments, the planarization process may be omitted, for example, if the TSVs 126 and the through vias 116 are already exposed.

Figure 7:
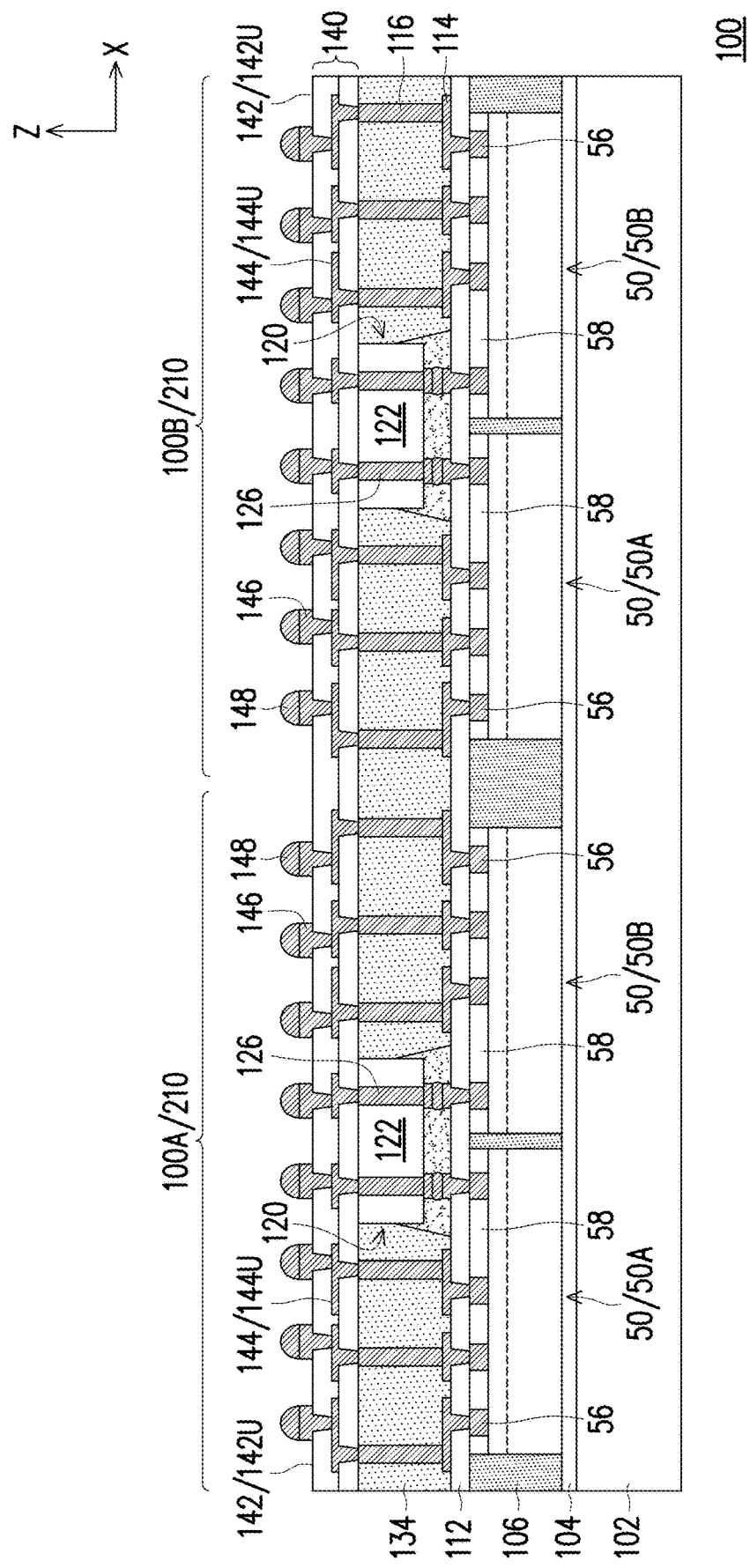

In FIG. 7, a redistribution structure 140 is formed on the top surfaces of the encapsulant 134, the interconnection dies 120 (e.g., the substrates 122 and the TSVs 126), and the through vias 116. The redistribution structure 140 includes dielectric layers 142 and metallization layers 144 (sometimes referred to as redistribution layers or redistribution lines) among the dielectric layers 142. For example, the redistribution structure 140 may include a plurality of metallization layers 144 separated from each other by respective dielectric layers 142. The metallization layers 144 of the redistribution structure 140 are connected to the through vias 116 and the interconnection dies 120 (e.g., the TSVs 126). Specifically, the metallization layers 144 are connected to the integrated circuit dies 50 by the TSVs 126 and/or the through vias 116.

In some embodiments, the dielectric layers 142 are formed of a polymer, which may be a photo-sensitive material such as PBO, polyimide, a BCB-based polymer, or the like, and may be patterned using a lithography mask. In other embodiments, the dielectric layers 142 are formed of a nitride such as silicon nitride; an oxide such as silicon oxide, PSG, BSG, BPSG; or the like. The dielectric layers 142 may be formed by spin coating, lamination, CVD, the like, or a combination thereof. After each dielectric layer 142 is formed, it is then patterned to expose underlying conductive features, such as portions of underlying through vias 116, TSVs 126, or metallization layers 144. The patterning may be by any acceptable process, such as by exposing the dielectrics layers to light when the dielectric layers 142 are a photo-sensitive material, or by etching using, for example, an anisotropic etch. In embodiments where the dielectric layers 142 are photo-sensitive materials, the dielectric layers 142 can be developed after the exposure.

The metallization layers 144 each include conductive vias and/or conductive lines. The conductive vias extend through a respective dielectric layer 142, and the conductive lines extend along the respective dielectric layer 142. As an example to form a metallization layer 144, a seed layer (not separately illustrated) is formed over the respective underlying features. For example, the seed layer can be formed on a respective dielectric layer 142 and in the openings through the respective dielectric layer 142. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization layer. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by any acceptable ashing or stripping process, such as using an oxygen plasma or the like. Once the photoresist is removed, exposed portions of the seed layer are removed, such as by using any acceptable etching process, such as by wet or dry etching. The remaining portions of the seed layer and conductive material form the metallization layer 144.

The redistribution structure 140 is illustrated as an example. More or fewer dielectric layers 142 and metallization layers 144 than illustrated may be formed in the redistribution structure 140 by repeating or omitting the steps previously described.

Under-bump metallizations (UBMs) 146 are formed for external connection to the redistribution structure 140. The UBMs 146 have bump portions on and extending along the top surface of the upper dielectric layer 142U of the redistribution structure 140, and have via portions extending through the upper dielectric layer 142U of the redistribution structure 140 to physically and electrically couple the upper metallization layer 144U of the redistribution structure 140. As a result, the UBMs 146 are electrically connected to the through vias 116 and the interconnection dies 120 (e.g., the TSVs 126). The UBMs 146 may be formed of the same material as the metallization layers 144, and may be formed by a similar process as the metallization layers 144. In some embodiments, the UBMs 146 have a different size (such as a greater size) than the metallization layers 144.

Conductive connectors 148 are formed on the UBMs 146. The conductive connectors 148 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 148 may include a conductive material such as solder, copper, aluminum, gold, nickel, silver, palladium, tin, the like, or a combination thereof. In some embodiments, the conductive connectors 148 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 148 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. The conductive connectors 148 are disposed at the front-sides of the package components 210.

Figure 8:
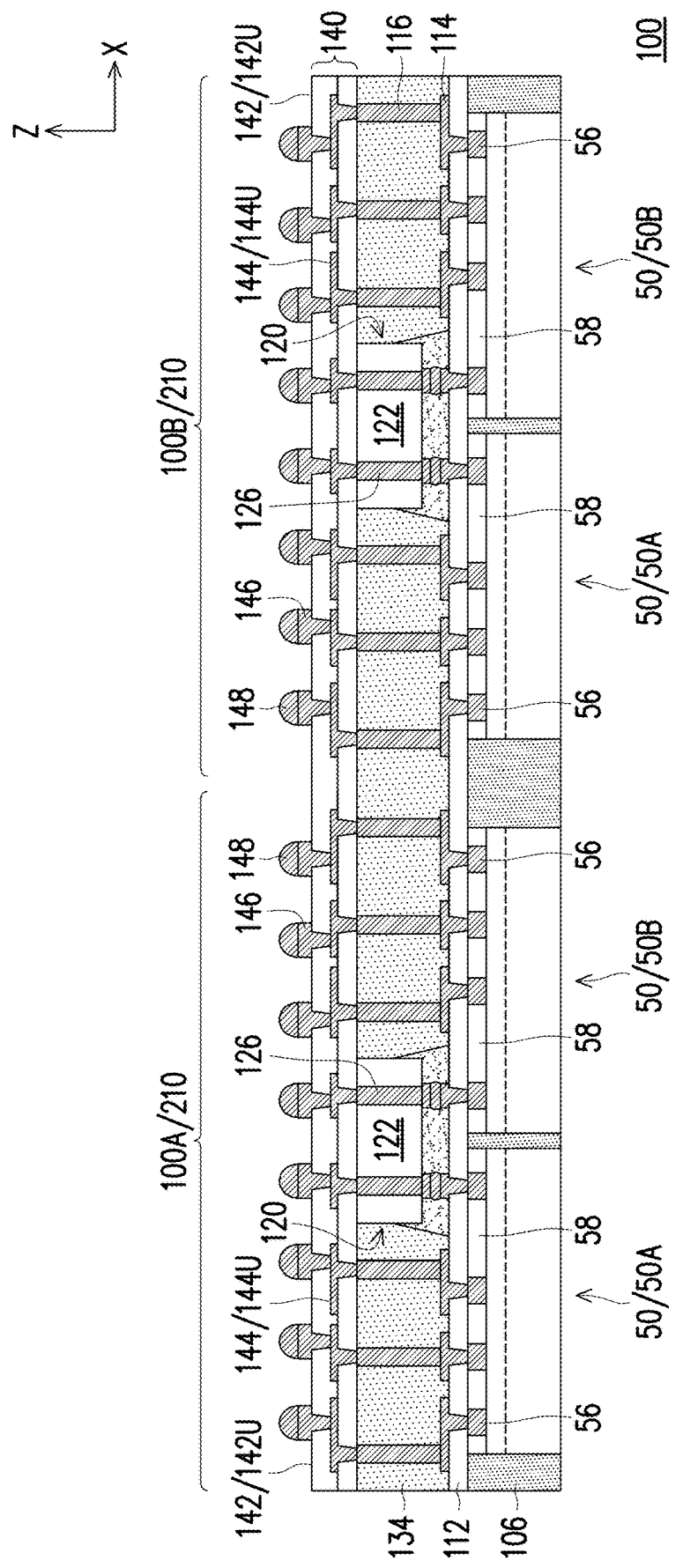

In FIG. 8, a carrier substrate debonding process is performed to detach (or "debond") the carrier substrate 102 from the integrated circuit dies 50 and the encapsulant 106. After the carrier substrate 102 is removed, the integrated circuit dies 50 and the encapsulant 106 are exposed at the back-sides of the package components 210. In some embodiments, the debonding process includes projecting a light such as a laser light or an UV light on the release layer 104 so that the release layer 104 decomposes under the heat of the light and the carrier substrate 102 can be removed. A cleaning process may optionally be performed to remove residue of the release layer 104. The structure is then flipped over and placed on any acceptable support structure (not separately illustrate), such as tape or a frame.

Figure 9:
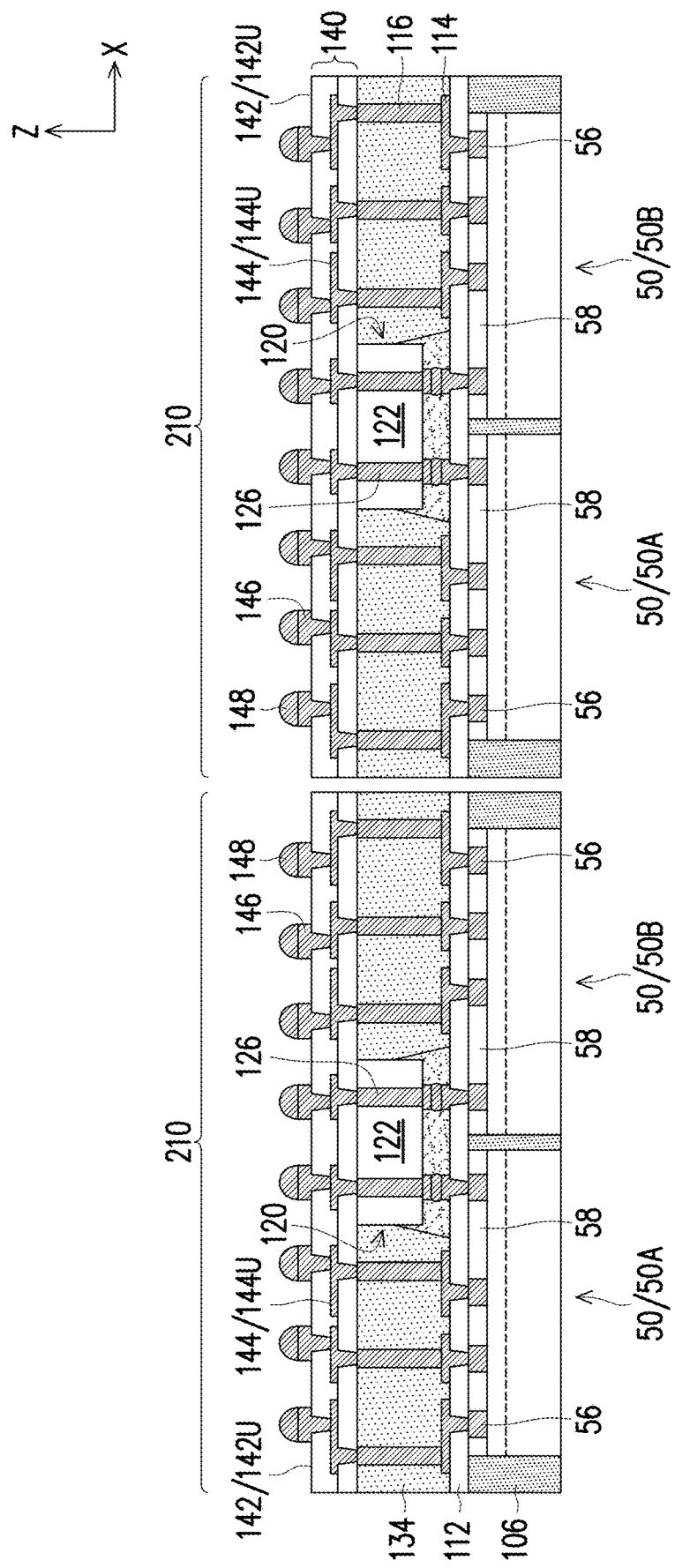

In FIG. 9, a singulation process is performed along scribe line regions, e.g., between the package regions 100A, 100B of the wafer 100. The singulation process may be a sawing process, a laser cutting process, or the like. The singulation process singulates the package regions 100A, 100B of the wafer 100 from each other. The resulting, singulated package components 210 are from the package regions 100A, 100B of the wafer 100.

Figure 10:
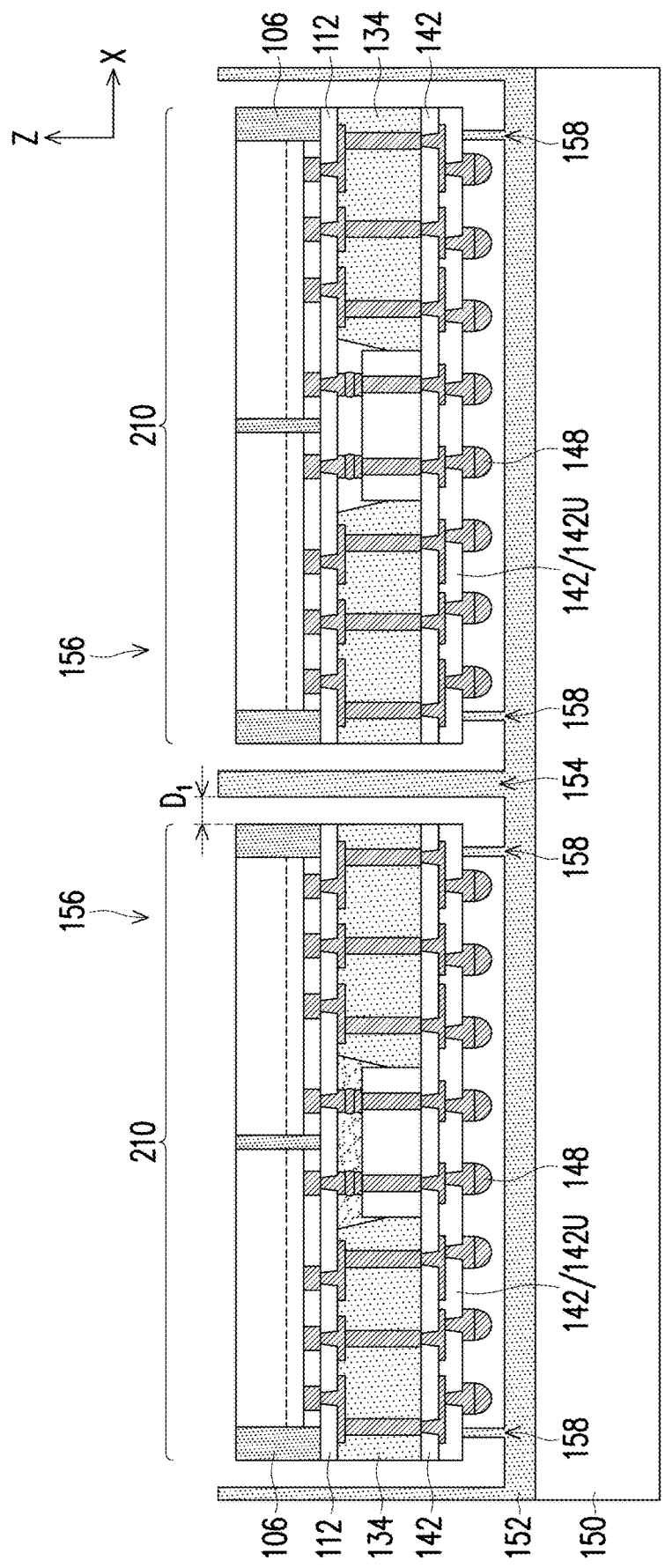
Figure 11:
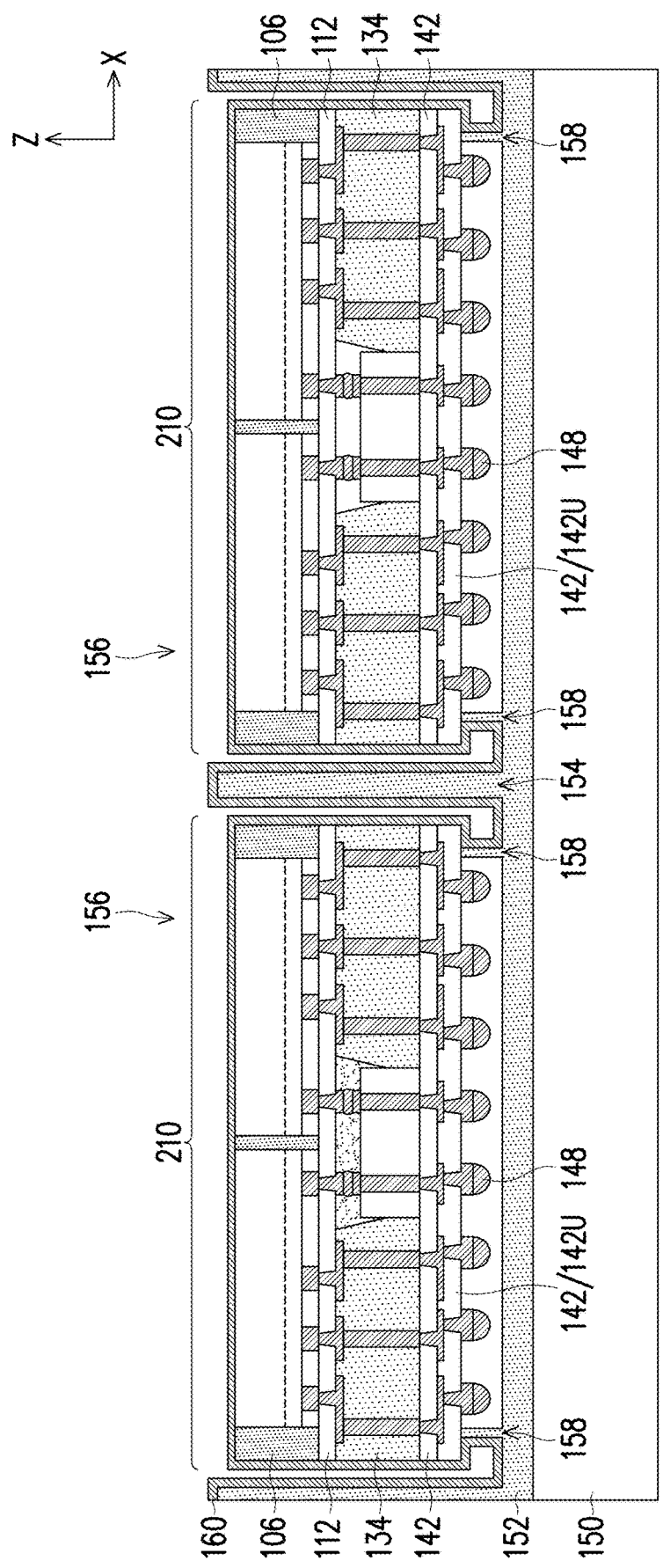
Figure 12:
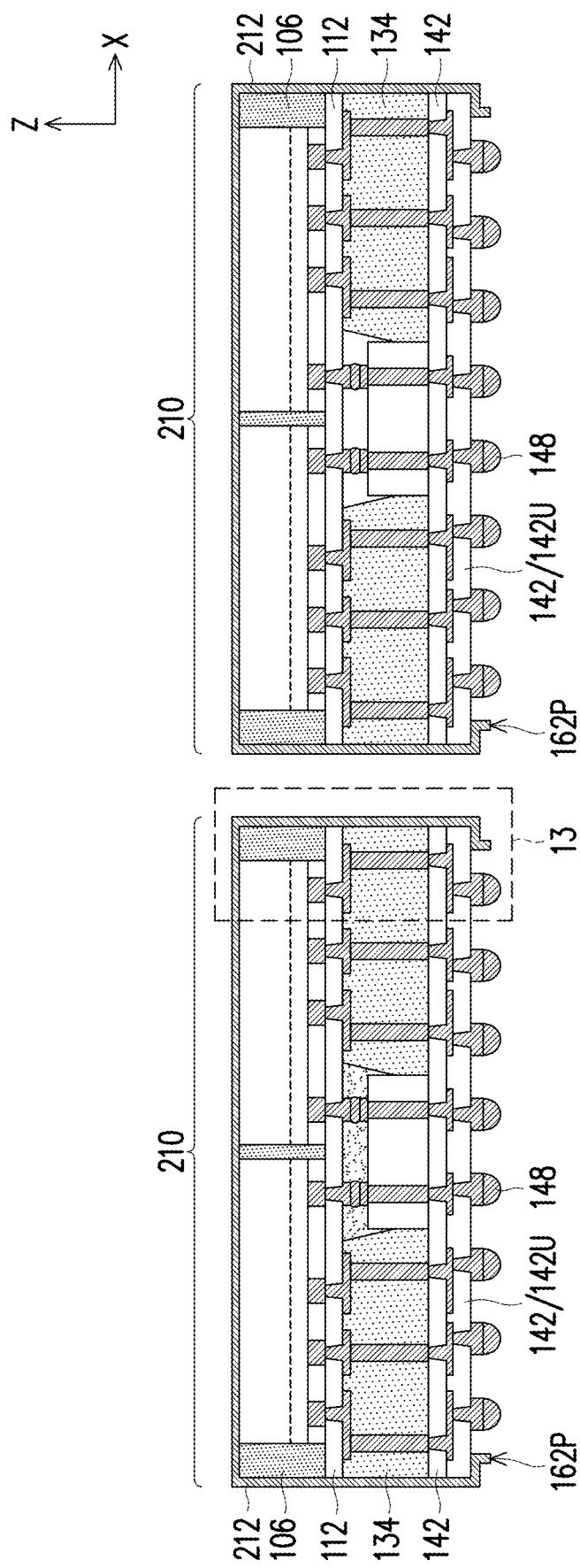

FIGS. 10-12 illustrate various additional steps in the manufacturing of embodiment packages. Heat dissipation structures 212 (see FIG. 12) will be formed around at least three sides of the package components 210. As will be subsequently described in greater detail, the heat dissipation structures 212 are advantageously formed after the package components 210 are singulated from the wafer 100 (see FIGS. 8-9).

In FIG. 10, the package components 210 are placed on a support structure 152. The support structure 152 may be tape, a tray, a frame, or the like. The support structure 152 is supported by a carrier substrate 150. The carrier substrate 150 may be similar to the carrier substrate 102 (previously described for FIG. 2), or may be different. In some embodiments, the carrier substrate 150 is a chuck for a sputtering module, which will subsequently be used to deposit the material of the heat dissipation structures.

In this embodiment, the support structure 152 is a tray (or jig), which is designed to support the package components 210 according to the size of the package components 210 and the positions of the conductive connectors 148. The tray may be formed of a rigid material such as metal, plastic, or the like. The tray includes walls 154 extending from a major surface of the tray. The walls 154 of the tray define recesses 156. The package components 210 will be placed face-down in the recesses 156, so that the front-side surfaces of the package components 210 face the support structure 152. The package components 210 may be placed in corresponding recesses 156 by, e.g., a pick-and-place process. The width of the recesses 156 depends on the width of the package components 210 at this step of processing, and is determined by the distance between adjacent pairs of the walls 154. Specifically, the width of the recesses 156 is greater than the width of the package components 210 at this step of processing. In some embodiments, the width of the recesses 156 is in the range of 20 mm to 72 mm, and the width of the package components 210 at this step of processing is in the range of 18 mm to 70 mm. As will be subsequently described in greater detail, the width of the recesses 156 is selected to control the distance Di between the sidewalls of the package components 210 and the walls 154 of the tray. In some embodiments, the distance Di is in the range of 25 µm to 500 µm. The tray further includes standoffs 158 at the bottoms of the recesses 156. Each package component 210 is placed in a corresponding recess 156 so that the top surface of the upper dielectric layer 142U is disposed on and in contact with the standoffs 158 at the bottom of the corresponding recess 156, and so that the standoffs 158 are disposed around the conductive connectors 148. The standoffs 158 may extend continuously or discontinuously around the conductive connectors 148 in a top-down view. The width of the spacing between the standoffs 158 depends on the positions of the conductive connectors 148. Specifically, the width of the spacing between the standoffs 158 is less than the width of the package components 210 at this step of processing. In some embodiments, the width of the spacing between the standoffs 158 is in the range of 0.5 mm to 5 mm. The height of the standoffs 158 depends on the height of the conductive connectors 148. Specifically, the height of the standoffs 158 is greater than the height of the conductive connectors 148. In some embodiments, the height of the standoffs 158 is in the range of 50 µm to 2000 µm. In some embodiments where the support structure 152 is a tray, the package components 210 are placed on the standoffs 158 without adhering the package components 210 to the support structure 152. The omission of an adhesive may allow a glue cleaning process to be omitted in subsequent processing, reducing manufacturing costs and increasing yield of the package components 210. In another embodiment (subsequently described for FIGS. 23-27), the support structure 152 is tape.

In FIG. 11, a heat dissipation layer 160 is formed over the support structure 152 and the package components 210. The heat dissipation layer 160 is formed a material with high thermal conductivity, such as a metal or metal nitride, such as such as aluminum, titanium, titanium nitride, nickel, nickel vanadium, silver, gold, septunseptium, copper, combinations thereof, or the like, which may be conformally formed by a PVD process such as sputtering or evaporation, a plating process such as electroless plating or electroplating, a printing process such as inkjet printing, or the like. In some embodiments, the heat dissipation layer 160 is formed of copper by a sputtering process. In some embodiments where the heat dissipation layer 160 is formed by a sputtering process, the carrier substrate 150 may be a chuck for a sputtering module, and a bias voltage or bias power may be applied to the chuck during deposition of the heat dissipation layer 160. The heat dissipation layer 160 will subsequently be singulated so that each package component 210 includes a portion of the heat dissipation layer 160.

The heat dissipation layer 160 is formed after the package components 210 are singulated. Further, the heat dissipation layer 160 is formed by a conformal process. As such, the heat dissipation layer 160 can be formed on the back-side surfaces and the sidewalls of the package components 210. Specifically, for each package component 210, the heat dissipation layer 160 is on the back-side surfaces of the integrated circuit dies 50 and the encapsulant 106, and on the sidewalls of the encapsulant 106, the dielectric layer 112, the encapsulant 134, and the dielectric layers 142. Such a heat dissipation layer 160 has a greater surface area than a heat dissipation layer which is not formed on the sidewalls of the package components 210, thus improving heat dissipation in the package components 210. Further, forming the heat dissipation layer 160 after the package components 210 are singulated may allow adhesion and glue cleaning process(es) to be omitted, as compared to a heat dissipation layer which is formed before the package components 210 are singulated, reducing manufacturing costs and increasing yield of the package components 210. Further yet, more singulated package components 210 may be simultaneously processed on the carrier substrate 150, as compared to the processing to unsingulated package components 210, reducing manufacturing costs.

In some embodiments where the support structure 152 is a tray, the heat dissipation layer 160 is formed on the top surfaces and the sidewalls of the support structure 152. Specifically, the heat dissipation layer 160 is on the top surfaces and the sidewalls of the walls 154, and is on the outer sidewalls of the standoffs 158. The heat dissipation layer 160 may also be formed on portions of the front-side surfaces of the package components 210, such as on portions of the top surfaces of the upper dielectric layers 142U which are between the standoffs 158 and the sidewalls of the upper dielectric layers 142U. The heat dissipation layer 160 is not formed on the inner sidewalls of the standoffs 158. Because the standoffs 158 are disposed around the conductive connectors 148, they protect the conductive connectors 148, preventing the heat dissipation layer from being formed on the sidewalls of the conductive connectors 148. Shorting of the conductive connectors 148 may thus be avoided, increasing yield of the package components 210.

In FIG. 12, the heat dissipation layer 160 is singulated and the package components 210 are removed from the support structure 152. After the heat dissipation layer 160 is singulated, each package component 210 includes a heat dissipation structure 212, which includes a singulated portion of the heat dissipation layer 160. The heat dissipation structure 212 may thus also be referred to as a heat dissipation layer, or more generally, a metal layer. The heat dissipation layer 160 may be singulated by lifting the package components 210 from the support structure 152. In some embodiments where the support structure 152 is a tray, the package components 210 are removed from the support structure 152 by lifting the package components 210 out of the recesses 156. In some embodiments, the heat dissipation layer 160 is singulated by the process for removing the package components 210 from the support structure 152. For example, a package component 210 may be lifted out of a corresponding recess 156 so that the heat dissipation layer 160 is torn or broken during the lifting of the package component 210, thus forming the heat dissipation structure 212. In another embodiment, the heat dissipation layer 160 is singulated by a laser cutting process or the like before the package components 210 are lifted out of the recesses 156.

The heat dissipation structures 212 extend along the back-side surfaces, the sidewalls, and (optionally) the front-side surfaces of the package components 210. In embodiments where the heat dissipation structures 212 are on the front-side surfaces of the package components 210, the heat dissipation structures 212 are on portions of the top surfaces of the upper dielectric layers 142U. In this embodiment, the heat dissipation structures 212 have projecting portions 212P which extend away from the upper dielectric layers 142U. The projecting portions 212P of the heat dissipation structure 212 are residual portions of the heat dissipation layer 160 which were on the outer sidewalls of the standoffs 158 (see FIG. 11). In another embodiment (subsequently described for FIG. 22), the portions of the heat dissipation structures 212 on the top surfaces of the upper dielectric layers 142U are substantially planar, having no projecting portions.

FIGS. 13A-13B are detailed views of a region 13 (see FIG. 12) of a package component 210. FIG. 13A shows a similar cross-sectional view of the package component 210 as FIG. 12. FIG. 13B shows a top-down view of the conductive connectors 148 and the upper dielectric layer 142U at a corner of the package component 210. The process (e.g., sputtering) used to form the material of the heat dissipation structure 212 may be non-uniform, and as such, the heat dissipation structure 212 may have different thicknesses along different surfaces of the package component 210. The thickness $T_2$ of the heat dissipation structure 212 at the sidewalls of the package component 210 may be less than or equal to the thickness $T_1$ of the heat dissipation structure 212 at the back-side surface of the package component 210. In some embodiment, the thickness $T_1$ is in the range of 0.1 μm to 8 μm, such as in the range of 0.2 μm to 1.5 μm. In some embodiment, the thickness $T_2$ is in the range of 0.05 μm to 6 μm, such as in the range of 0.1 μm to 1.0 μm. The thickness $T_3$ of the heat dissipation structure 212 at the front-side surface of the package component 210 may be less than or equal to the thickness $T_2$ of the heat dissipation structure 212 at the sidewalls of the package component 210. In some embodiment, the thickness $T_3$ is in the range of 0.01 μm to 4 μm, such as in the range of 0.01 μm to 0.8 μm. The thicknesses $T_2$, $T_3$ of the heat dissipation structure 212 are controlled by controlling the distance Di (see FIG. 10), with a smaller distance Di resulting in smaller thicknesses $T_2$, $T_3$ (e.g., such as due to crowding that reduces the deposition rate along the sidewalls and the front-side surface of the package component 210). In some embodiments, the distance Di is at least double the thickness $T_2$.

Although the heat dissipation structure 212 is formed on the front-side surface of the package component 210, the heat dissipation structure 212 is disposed a sufficient distance from the conductive connectors 148 to avoid shorting of the conductive connectors 148. In some embodiments, the portions of the heat dissipation structure 212 on the front-side surface of the package component 210 have a width $W_2$ which is less than a width $W_1$ between outer sidewalls of the conductive connectors 148 and a corresponding sidewall of the package component 210. In some embodiments, the width $W_1$ is in the range of 300 μm to 1500 μm, such as in the range of 500 μm to 900 μm. In some embodiments, the width $W_2$ is in the range of 0.05 μm to 1000 μm, such as in the range of 0.1 μm to 100 μm.

Figure 14:
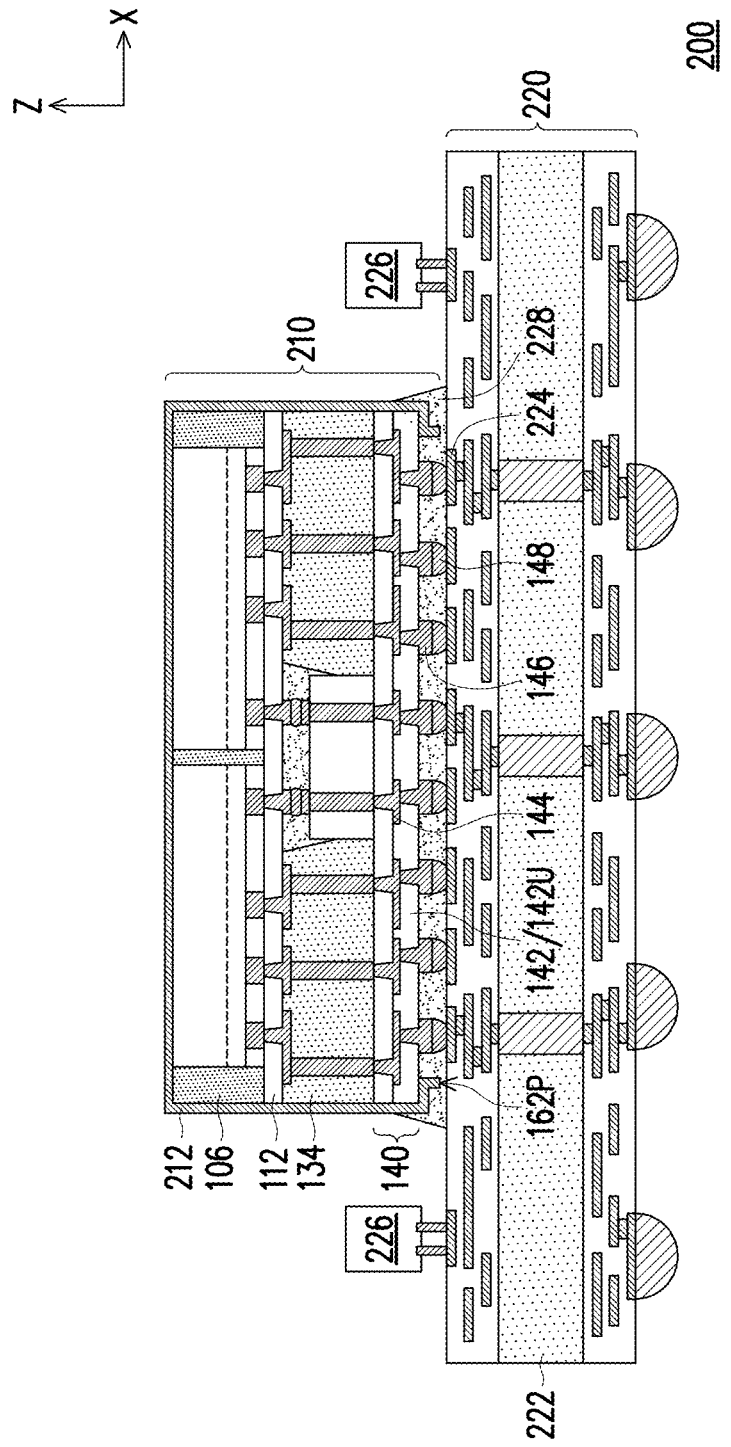
Figure 15:
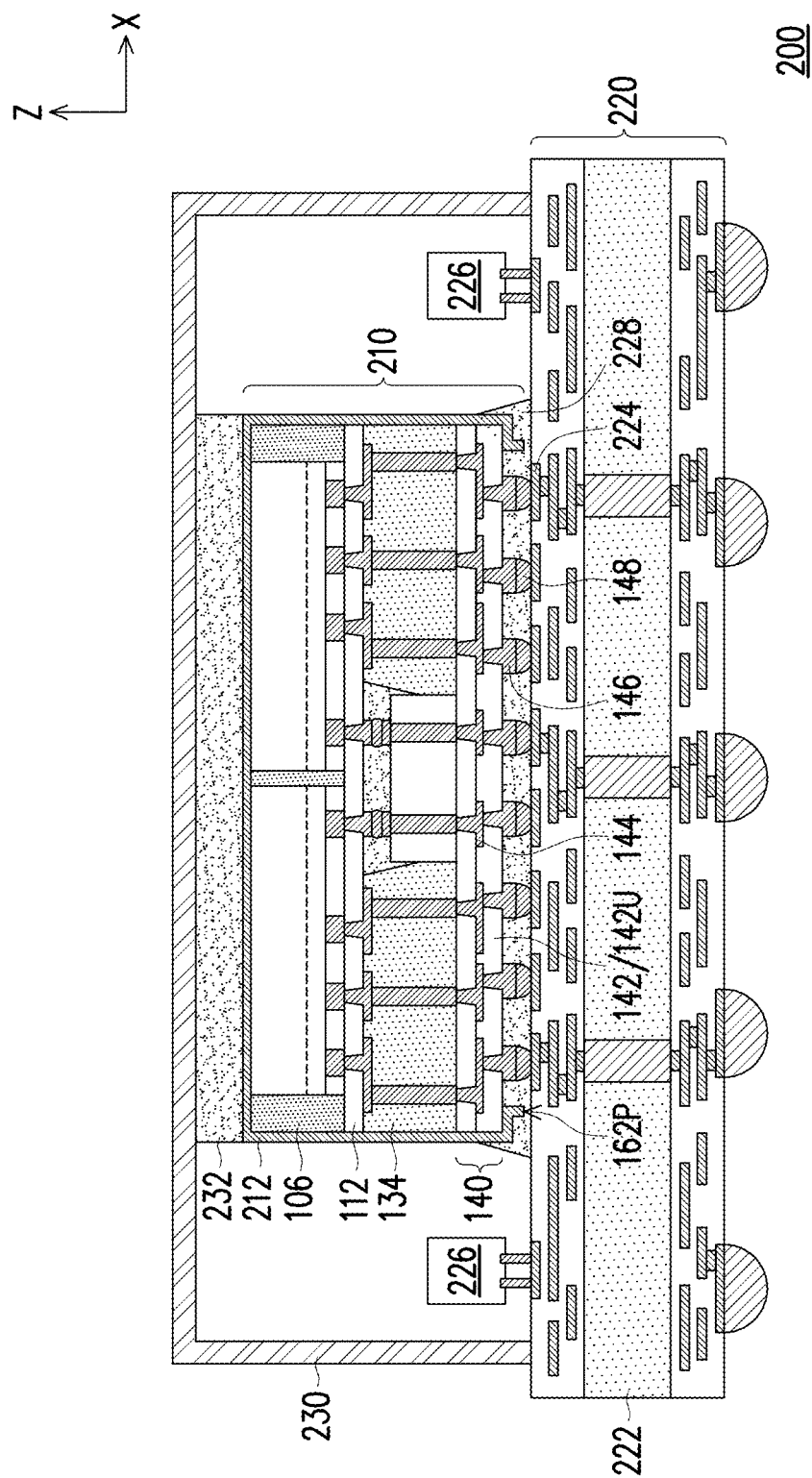

FIGS. 14-15 illustrate various additional steps in the manufacturing of embodiment packages. The package components 210 will be attached to package substrates 220 (see FIG. 15), thus completing formation of the integrated circuit packages 200. A single package component 210, a single package substrate 220, and a single integrated circuit package 200 are illustrated. It should be appreciated that multiple package components can be simultaneously processed to form multiple integrated circuit packages 200.

In FIG. 14, a package component 210 is attached to a package substrate 220 using the conductive connectors 148. The package substrate 220 includes a substrate core 222, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 222 may be a SOI substrate. Generally, an SOI substrate includes a layer of a semiconductor material such as epitaxial silicon, germanium, silicon germanium, SOI, SGOI, or combinations thereof. In another embodiment, the substrate core 222 is an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate core 222.

The substrate core 222 may include active and passive devices (not separately illustrated). Devices such as transistors, capacitors, resistors, combinations thereof, and the like may be used to generate the structural and functional requirements of the design for the system. The devices may be formed using any suitable methods.

The substrate core 222 may also include metallization layers and vias, and bond pads 224 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, or the like). In some embodiments, the substrate core 222 is substantially free of active and passive devices.

The conductive connectors 148 are reflowed to attach the UBMs 146 to the bond pads 224. The conductive connectors 148 connect the package component 210, including the metallization layers 144 of the redistribution structure 140, to the package substrate 220, including metallization layers of the substrate core 222. Thus, the package substrate 220 is electrically connected to the integrated circuit dies 50. In some embodiments, passive devices (e.g., surface mount devices (SMDs), not separately illustrated) may be attached to the package component 210 (e.g., bonded to the UBMs 146) prior to mounting on the package substrate 220. In such embodiments, the passive devices may be bonded to a same surface of the package component 210 as the conductive connectors 148. In some embodiments, passive devices 226 (e.g., SMDs) may be attached to the package substrate 220, e.g., to the bond pads 224.

In some embodiments, an underfill 228 is formed between the package component 210 and the package substrate 220, surrounding the conductive connectors 148. The underfill 228 may be formed by a capillary flow process after the package component 210 is attached or may be formed by any suitable deposition method before the package component 210 is attached. The underfill 228 may be a continuous material extending from the package substrate 220 to the redistribution structure 140 (e.g., to the upper dielectric layer 142U). In this embodiment, the underfill 228 physically contacts the portions of the heat dissipation structure 212 which extend along the top surface of the upper dielectric layer 142U. The underfill 228 may also physically contact the projecting portions 212P of the heat dissipation structure 212 (if present).

In FIG. 15, a heat spreader 230 is optionally attached to the package component 210. The heat spreader 230 may be a thermal lid, a heatsink, or the like. In the illustrated embodiment, the heat spreader 230 is a thermal lid which is also attached to the package substrate 220. A recess is in the bottom of the thermal lid so that the thermal lid can cover the package component 210. In some embodiments where the heat spreader 230 is a thermal lid, the thermal lid can also cover the passive devices 226. In another embodiment (subsequently described for FIG. 17), the heat spreader 230 is a heatsink.

The heat spreader 230 may be formed of a material with high thermal conductivity, such as a metal, such as copper, steel, iron, or the like. The heat spreader 230 protects the package component 210 and forms a thermal pathway to conduct heat from the various components of the package component 210 (e.g., the integrated circuit dies 50). The heat spreader 230 is thermally coupled to the back-side surface of the package component 210, e.g., a back-side surface of the heat dissipation structure 212.

In some embodiments, an adhesive layer 232 is used to adhere the heat spreader 230 to the package component 210. The adhesive layer 232 may be a thermal interface material (TIM), a die attach film (DAF), or the like, and is different from the heat dissipation structure 212. For example, the adhesive layer 232 may be formed of a TIM such as a solder paste, a polymeric material, or the like, which may be dispensed on the package component 210 (e.g., on the back-side surface of the heat dissipation structure 212) and/or on the heat spreader 230. In some embodiments, the adhesive layer 232 is a gold-tin solder paste. The heat spreader 230 may also be attached to the package component 210 by other techniques. Advantageously, the material of the adhesive layer 232 may adhere better to the heat dissipation structure 212 than to the encapsulant 106. Delamination of the heat spreader 230 from the package component 210 may thus be reduced, improving reliability of the resulting integrated circuit package 200. When the heat spreader 230 is attached to the package component 210, the adhesive layer 232 is disposed on the back-side surface of the heat dissipation structure 212. The material of the adhesive layer 232 may overflow during adhesion of the heat spreader 230 to the package component 210, e.g., as a result of extrusion that occurs when the heat spreader 230 is pressed onto the adhesive layer 232. As such, in some embodiments (subsequently described for FIG. 16), the adhesive layer 232 is also formed on first portions of the sidewalls of the heat dissipation structure 212 such as the portions along the sidewalls of the encapsulant 106. In either case, second portions of the sidewalls of the heat dissipation structure 212, such as the portions along the sidewalls of the redistribution structure 140, are free of the adhesive layer 232.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 16:
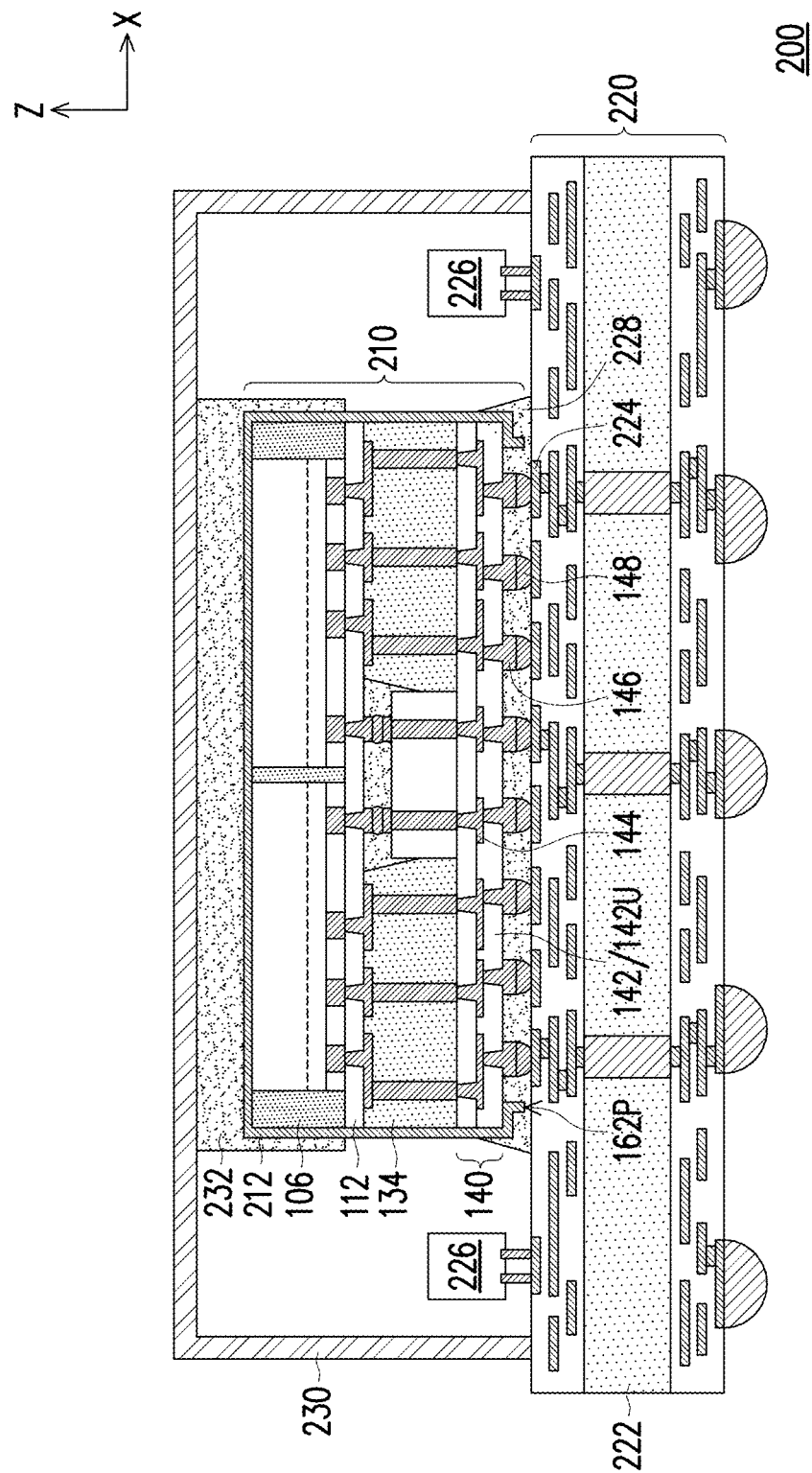
FIG. 16 is a view of an integrated circuit package, in accordance with some other embodiments.

FIG. 16 is a view of an integrated circuit package 200, in accordance with some embodiments. This embodiment is similar to the embodiment described for FIG. 15, except the adhesive layer 232 is also formed on the sidewalls of the heat dissipation structure 212. The heat dissipation structure 212 acts as a barrier layer on the sidewalls of the package component 210, preventing the adhesive layer 232 from flowing into the interfaces of the encapsulant 106, the dielectric layer 112, the encapsulant 134, and/or the dielectric layers 142. Contamination in the package component 210 may thus be reduced, improving reliability of the resulting integrated circuit package 200.

Figure 17:
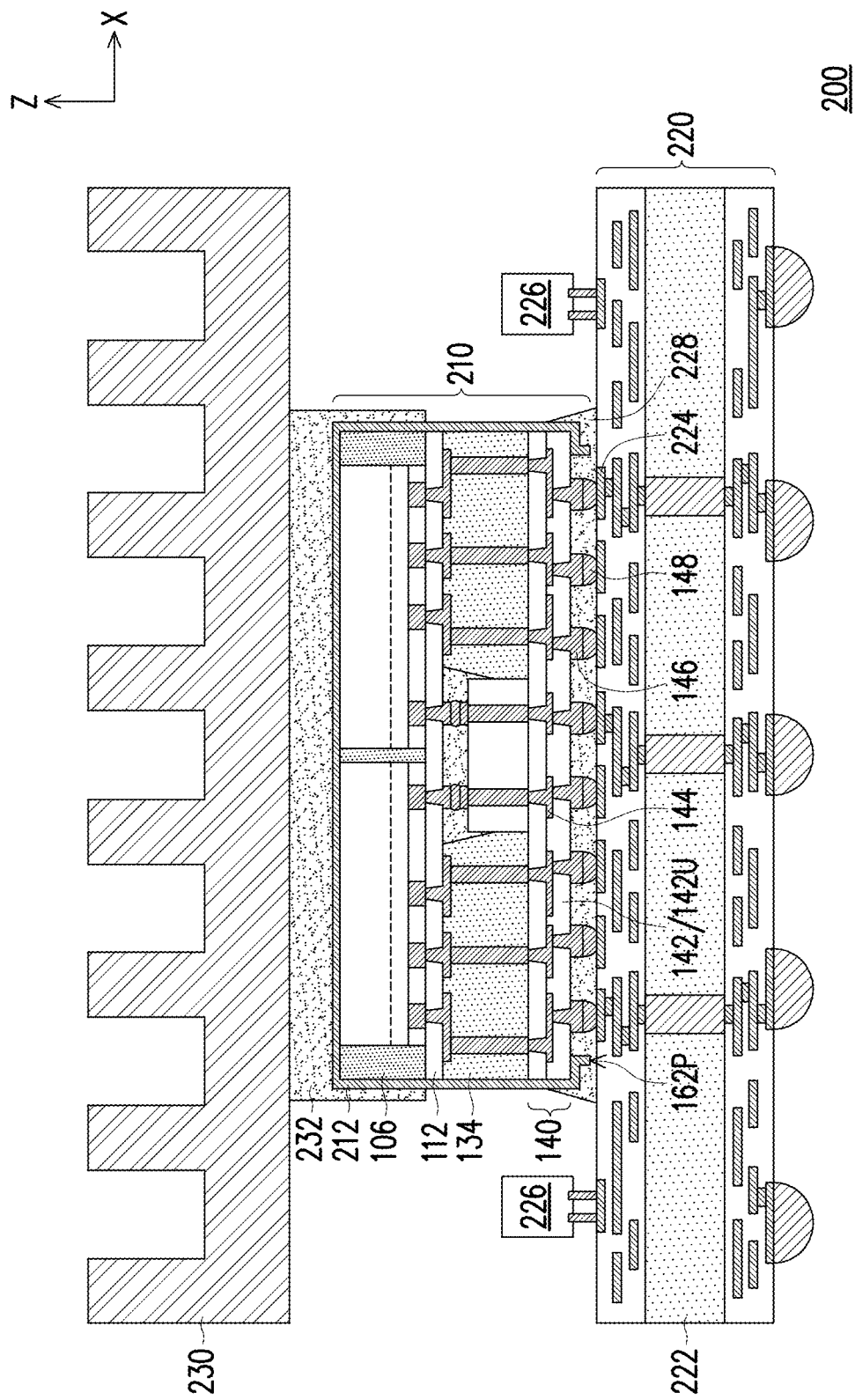
FIG. 17 is a view of an integrated circuit package, in accordance with some other embodiments.

FIG. 17 is a view of an integrated circuit package 200, in accordance with some other embodiments. This embodiment is similar to the embodiment described for FIG. 16, except the heat spreader 230 is a heatsink. In this embodiment, the heatsink includes fins extending upwardly, away from the package component 210. Also in this embodiment, the heatsink is wider than the package component 210 such that sidewalls of the heat spreader 230 extend laterally beyond sidewalls of the heat dissipation structure 212.

Figure 18:
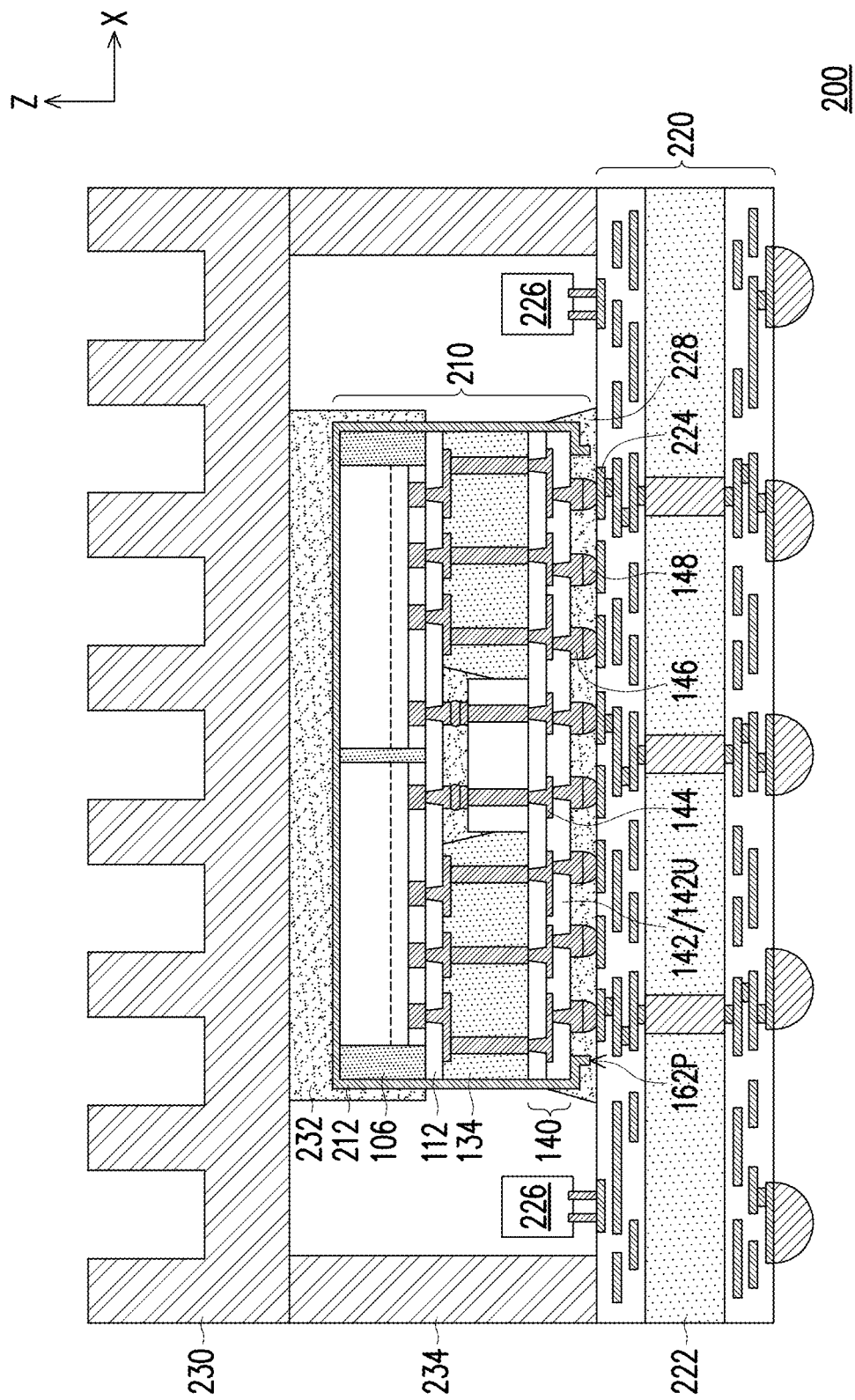
FIG. 18 is a view of an integrated circuit package, in accordance with some other embodiments.

FIG. 18 is a view of an integrated circuit package 200, in accordance with some other embodiments. This embodiment is similar to the embodiment described for FIG. 17, except the integrated circuit package 200 further includes a support ring 234. The support ring 234 may be formed of a material with high thermal conductivity, such as a metal, such as copper, steel, iron, or the like. The support ring 234 provides mechanical reinforcement for the integrated circuit package 200, and may prevent warpage of the integrated circuit package 200. The support ring 234 may be attached to the package substrate 220 by any suitable adhesive.

Figure 19:
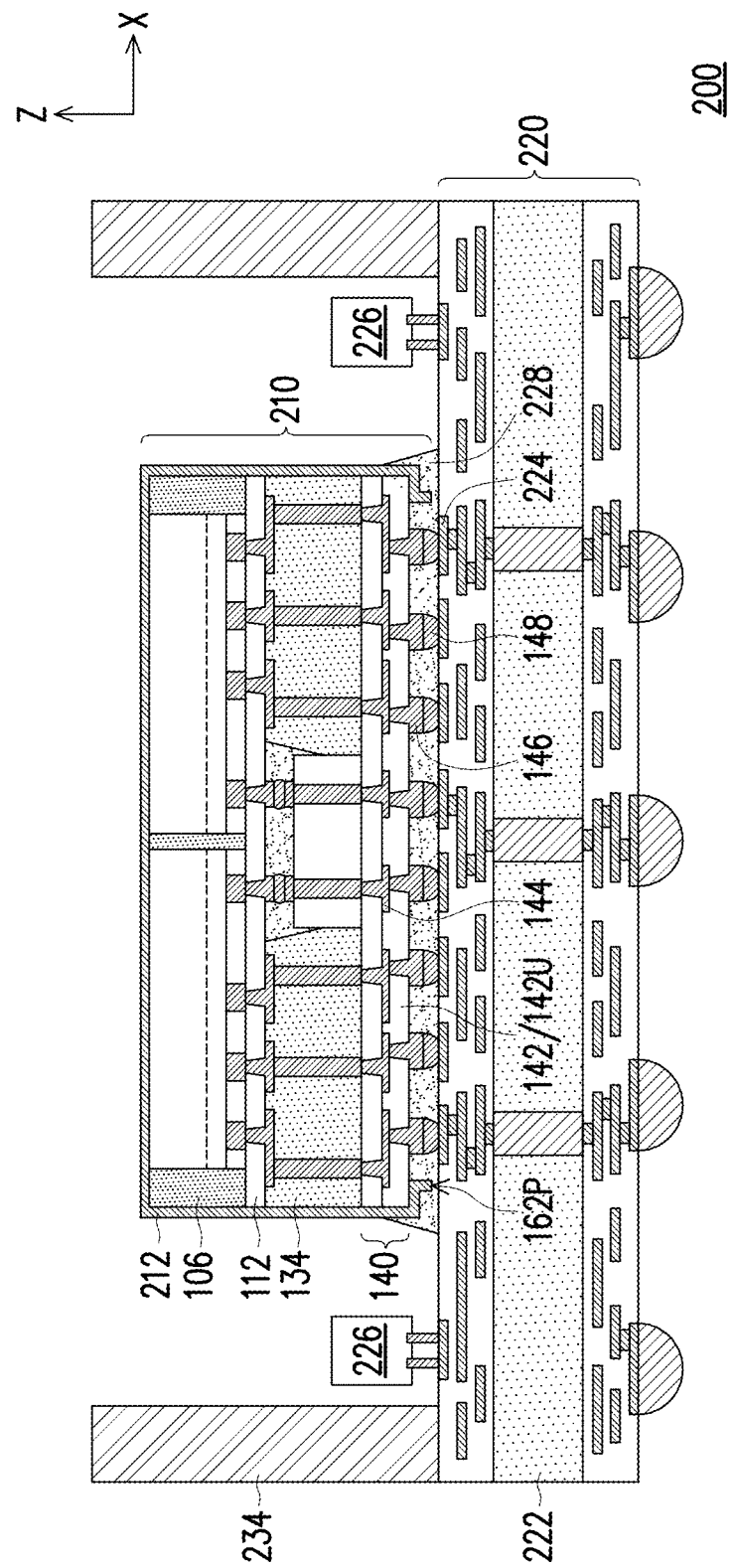
FIG. 19 is a view of an integrated circuit package, in accordance with some other embodiments.

FIG. 19 is a view of an integrated circuit package 200, in accordance with some other embodiments. This embodiment is similar to the embodiment described for FIG. 18, except the adhesive layer 232 and the heat spreader 230 are omitted. The heat dissipation structures 212 may provide a sufficient thermal pathway to conduct heat from the various components of the package component 210 (e.g., the integrated circuit dies 50), obviating the heat spreader 230. Omitting the heat spreader 230 allows the size of the integrated circuit package 200 to be reduced.

Figure 20:
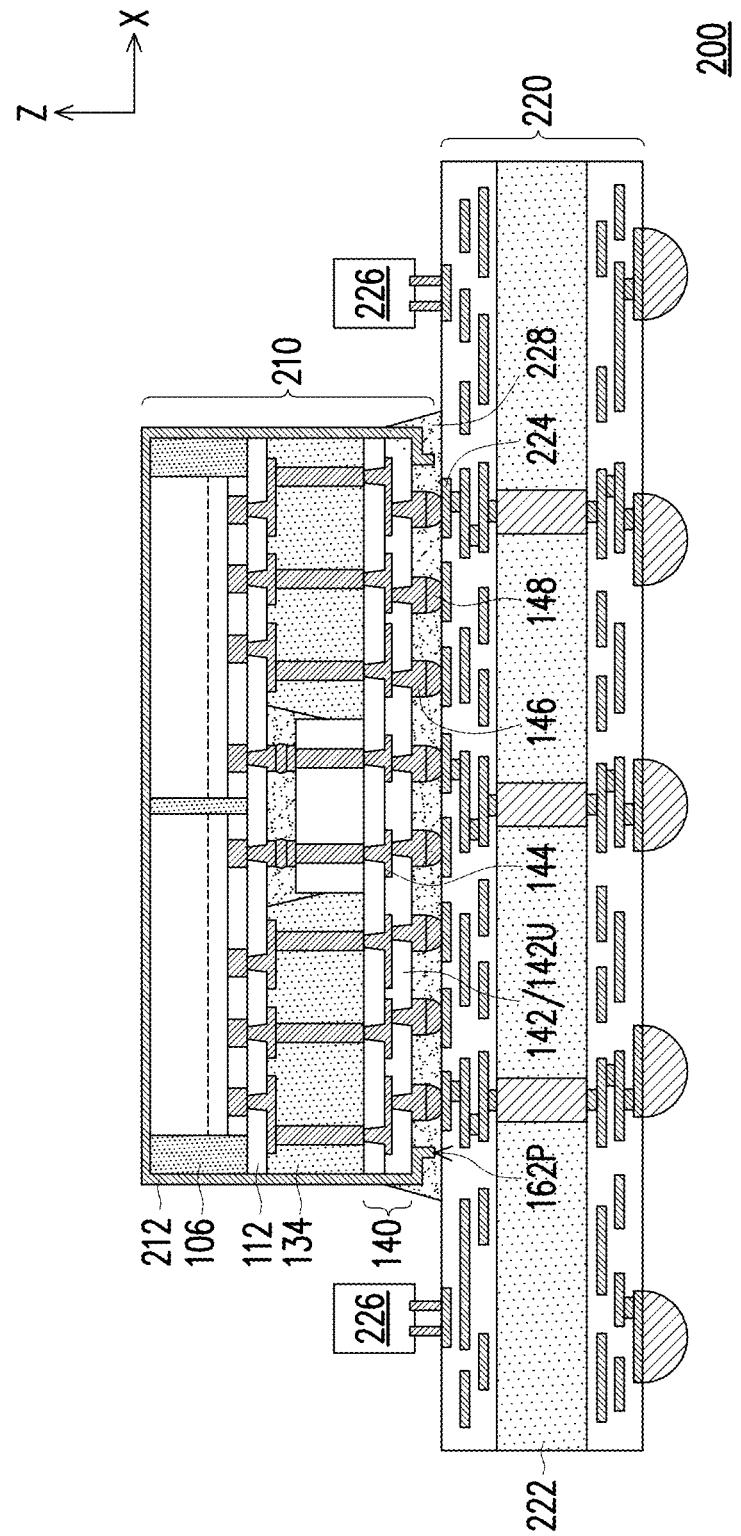
FIG. 20 is a view of an integrated circuit package, in accordance with some other embodiments.

FIG. 20 is a view of an integrated circuit package 200, in accordance with some other embodiments. This embodiment is similar to the embodiment described for FIG. 19, except the support ring 234 is also omitted. Omitting the support ring 234 allows the size of the integrated circuit package 200 to be reduced.

Figure 21:
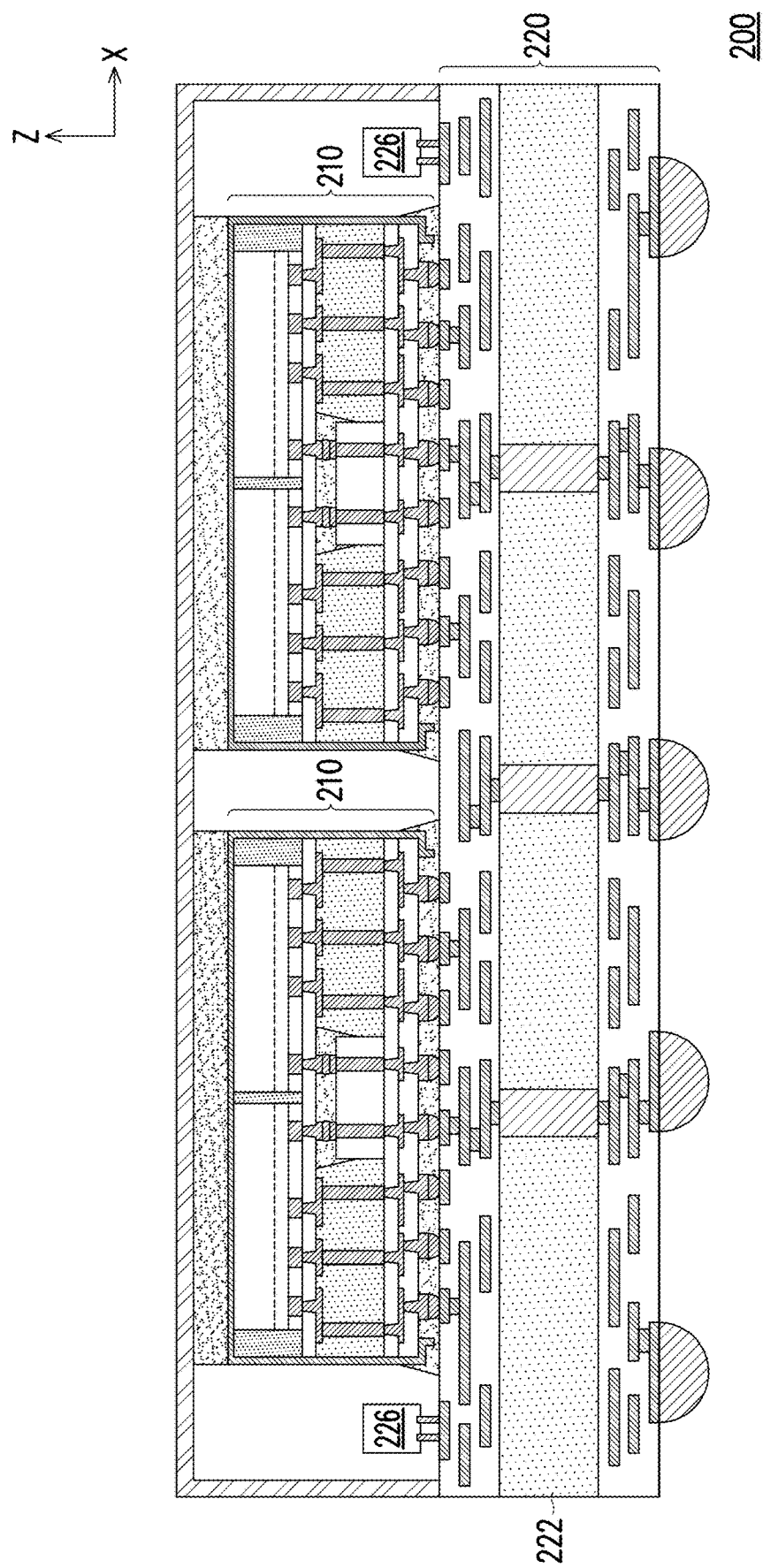
FIG. 21 is a view of an integrated circuit package, in accordance with some other embodiments.

FIG. 21 is a view of an integrated circuit package 200, in accordance with some other embodiments. This embodiment is similar to the embodiment described for FIG. 15, except the integrated circuit package 200 includes multiple package components 210 attached to a package substrate 220. It should be appreciated that any of the integrated circuit packages 200 described for FIGS. 15-20 may include multiple package components 210 attached to a package substrate 220.

Figure 22:
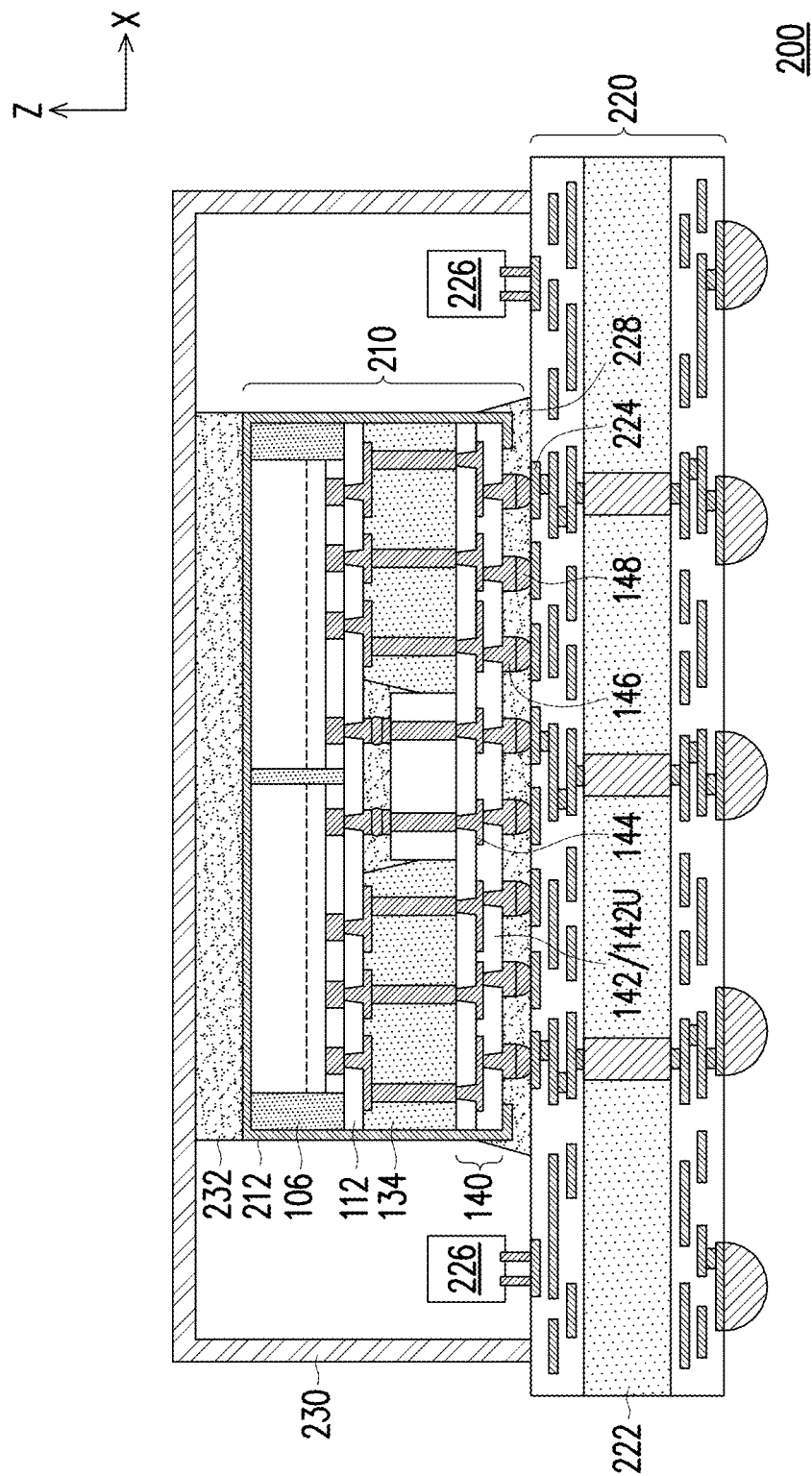
FIG. 22 is a view of an integrated circuit package, in accordance with some other embodiments.

FIG. 22 is a view of an integrated circuit package 200, in accordance with some other embodiments. This embodiment is similar to the embodiment described for FIG. 15, except the portions of the heat dissipation structure 212 on the top surface of the upper dielectric layer 142U lack projecting portions 212P (see FIG. 15). Thus, the portions of the heat dissipation structure 212 on the top surface of the upper dielectric layer 142U are substantially planar as they extend along the top surface of the upper dielectric layer 142U. It should be appreciated that any of the integrated circuit packages 200 described for FIGS. 15-21 may have heat dissipation structures 212 without projecting portions 212P.

Figure 23:
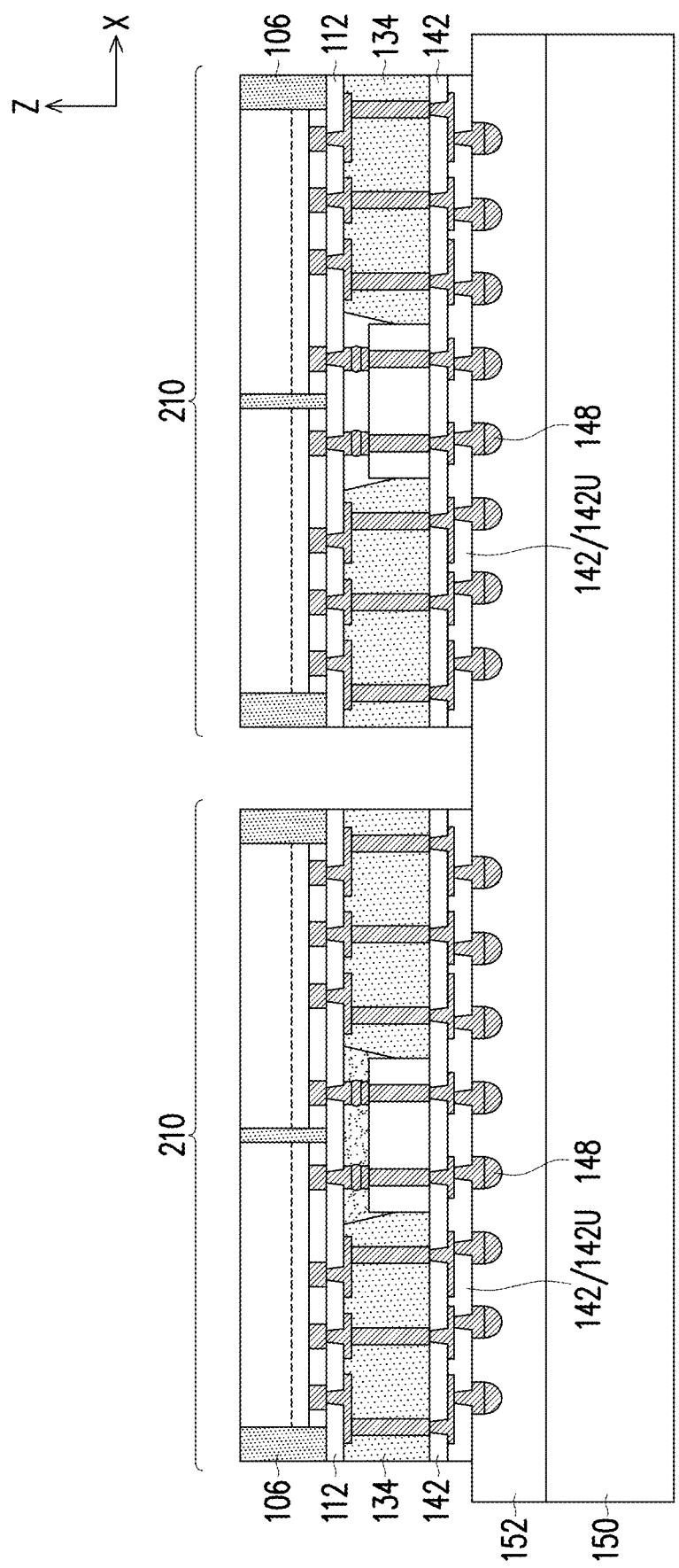
FIGS. 23-27 are views of intermediate stages in the manufacturing of integrated circuit packages, in accordance with some other embodiments.
Figure 24:
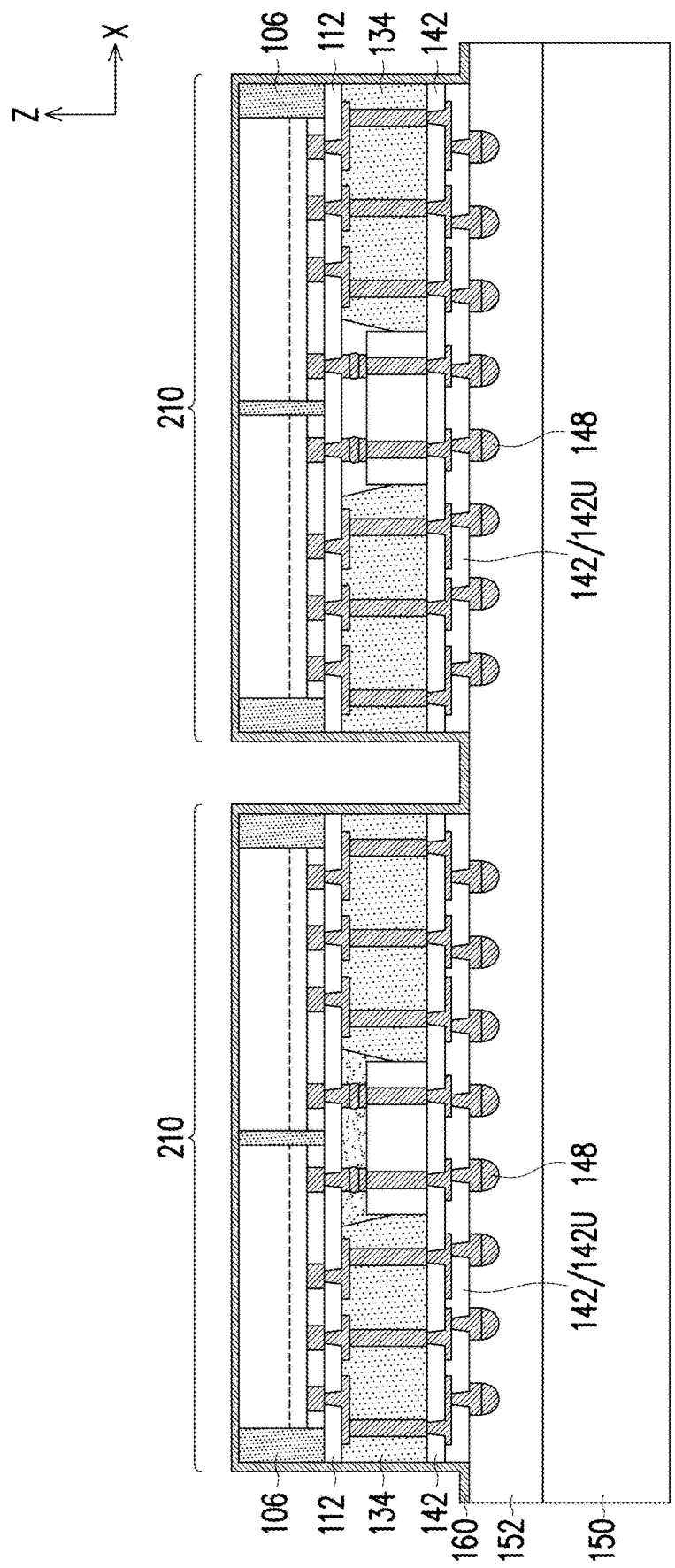
Figure 25:
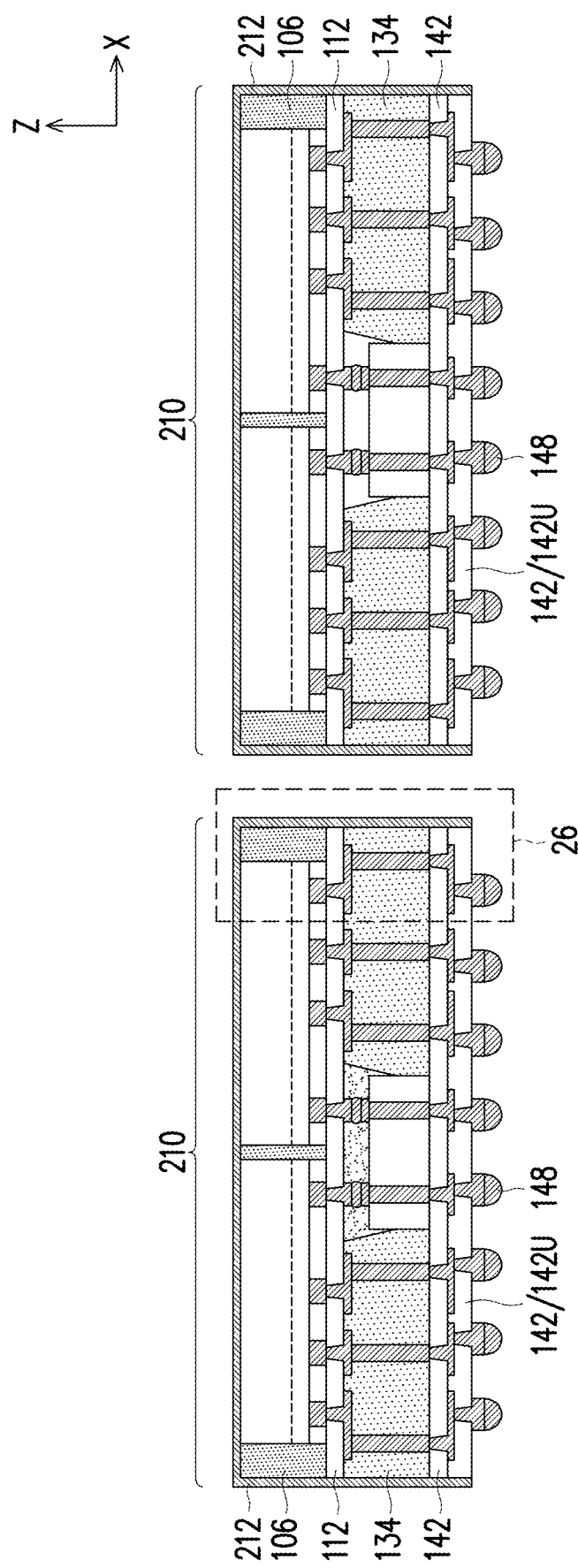

FIGS. 23-27 are views of intermediate stages in the manufacturing of integrated circuit packages 200, in accordance with some other embodiments. Specifically, FIGS. 23-25 illustrate a process for forming heat dissipation structures 212 (see FIG. 25) around at least three sides of the package components 210. Similar to the embodiment of FIGS. 10-12, the heat dissipation structures 212 are advantageously formed after the package components 210 are singulated from the wafer 100 (see FIGS. 8-9).

In FIG. 23, the package components 210 are placed on a support structure 152, in a similar manner as described for FIG. 10. In this embodiment, the support structure 152 is tape, which is simpler and less expensive to use than a tray. The package components 210 are adhered to the support structure 152 by pressing the conductive connectors 148 into the tape until the upper dielectric layers 142U contact the tape. The front-side surfaces of the package components 210 (e.g., the top surfaces of the upper dielectric layers 142 and the surfaces of the conductive connectors 148) are thus covered and protected by the tape.

In FIG. 24, a heat dissipation layer 160 is formed over the support structure 152 and the package components 210, in a similar manner as described for FIG. 11. In this embodiment, the front-side surfaces of the package components 210 are free of the heat dissipation layer 160, as a result of the front-side surfaces of the package components 210 being covered by the support structure 152.

In FIG. 25, the heat dissipation layer 160 is singulated and the package components 210 are removed from the support structure 152, in a similar manner as described for FIG. 12. For example, a package component 210 may be lifted off the tape so that the heat dissipation layer 160 is torn or broken during the lifting of the package component 210, thus forming the heat dissipation structure 212. Heat dissipation structures 212 are thus formed from the remaining portions of the heat dissipation layer 160. The heat dissipation structures 212 extend along the sidewalls and the back-side surfaces of the package components 210, but not along the front-side surfaces of the package components 210. Optionally, a cleaning process such as a wet etch may be performed on the conductive connectors 148 after the package components 210 are removed from the support structure 152 (e.g., tape).

Figure 26B:
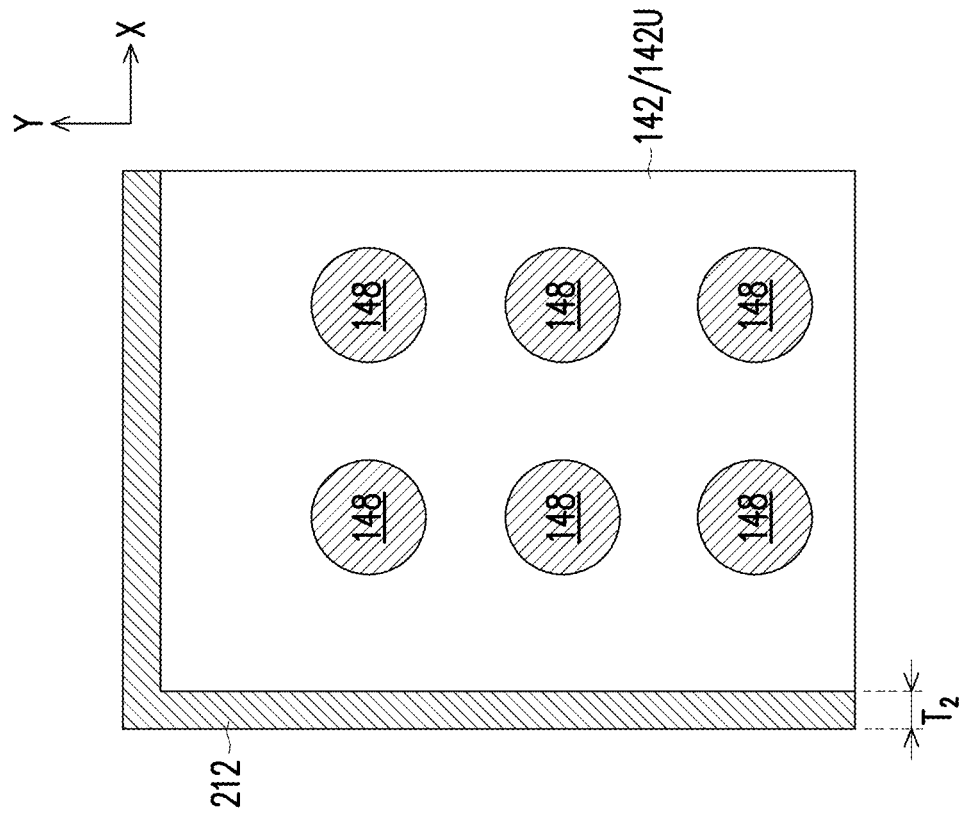
Figure 26A:
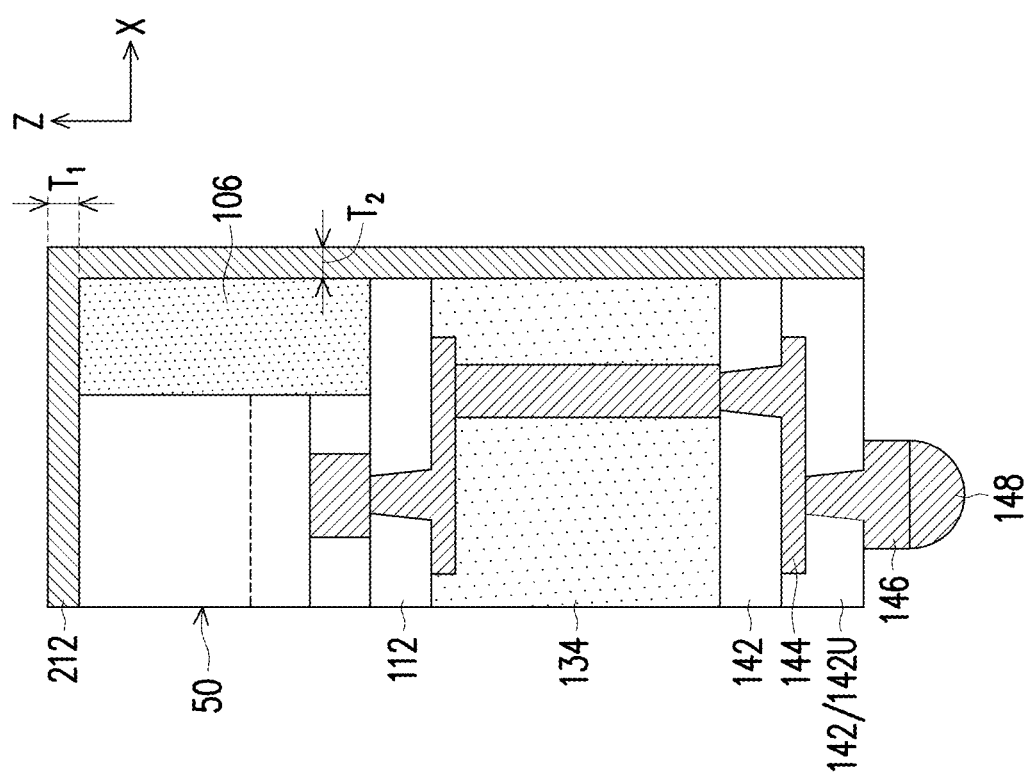

FIGS. 26A-26B are detailed views of a region 26 (see FIG. 25) of a package component 210. FIG. 26A shows a similar cross-sectional view of the package component 210 as FIG. 25. FIG. 26B shows a top-down view of the conductive connectors 148 and the upper dielectric layer 142U at a corner of the package component 210. In this embodiment, the front-side surfaces of the package components 210 are free from the heat dissipation structures 212. The heat dissipation structures 212 may have different thicknesses $T_1$, $T_2$ (as previously described for FIGS. 13A-13B).

Figure 27:
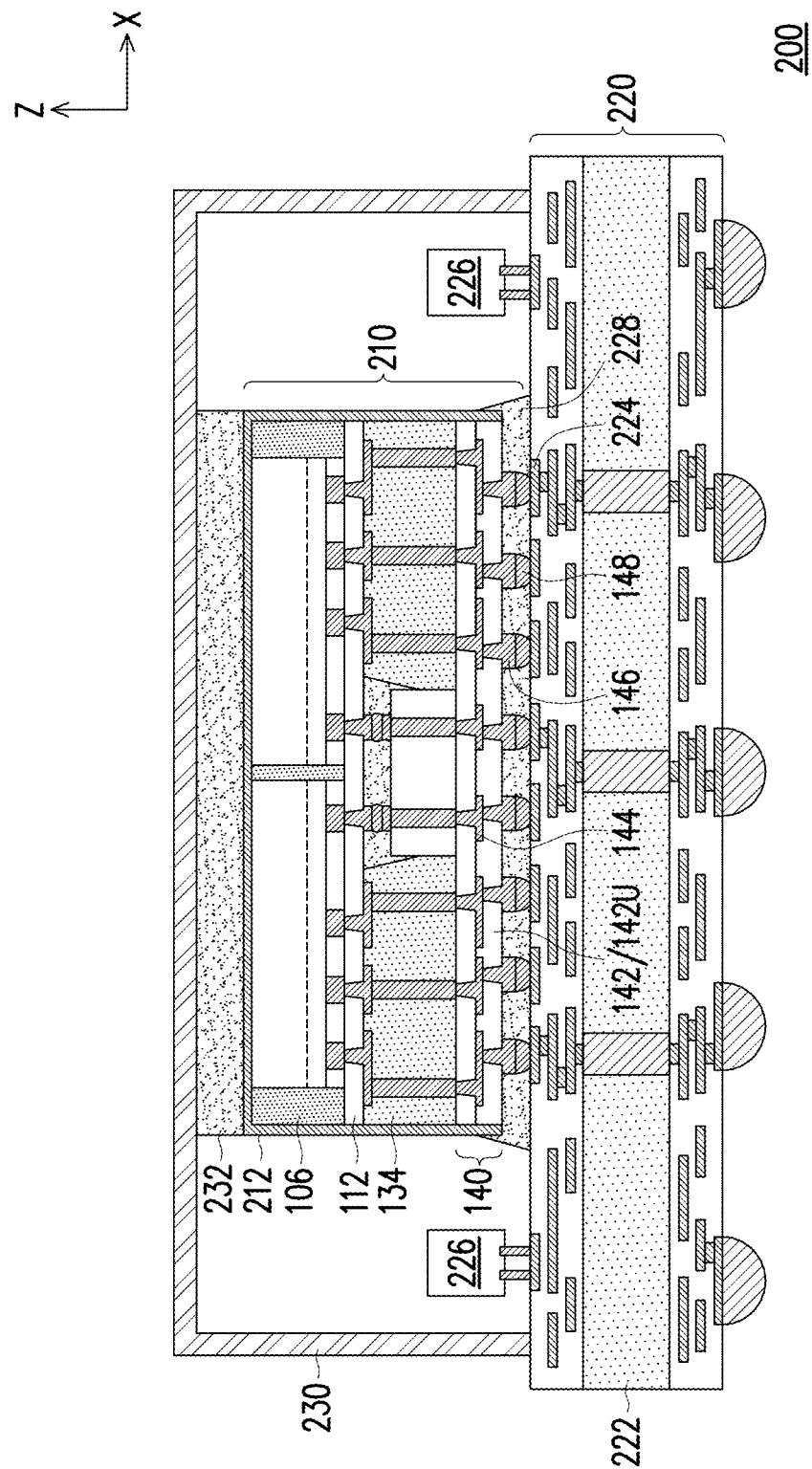

In FIG. 27, appropriate steps as described above are performed to complete the integrated circuit packages 200. The package components 210 of the resulting integrated circuit packages 200 are free from the heat dissipation structures 212. As a result, the underfill 228 physically contacts the top surface of the upper dielectric layer 142U. It should be appreciated that any of the integrated circuit packages 200 described for FIGS. 15-21 may have package components 210 where the front-side surfaces of the package components 210 are free from the heat dissipation structures 212.

FIGS. 28-33 are views of intermediate stages in the manufacturing of integrated circuit packages 200, in accordance with some other embodiments. FIGS. 28-33 are cross-sectional views of a process for forming package components 210 which include interposers, such as package components for chip-on-wafer-on-substrate (CoWoS) devices. The package components 210 may be chip-on-wafer (CoW) package components.

Figure 28:
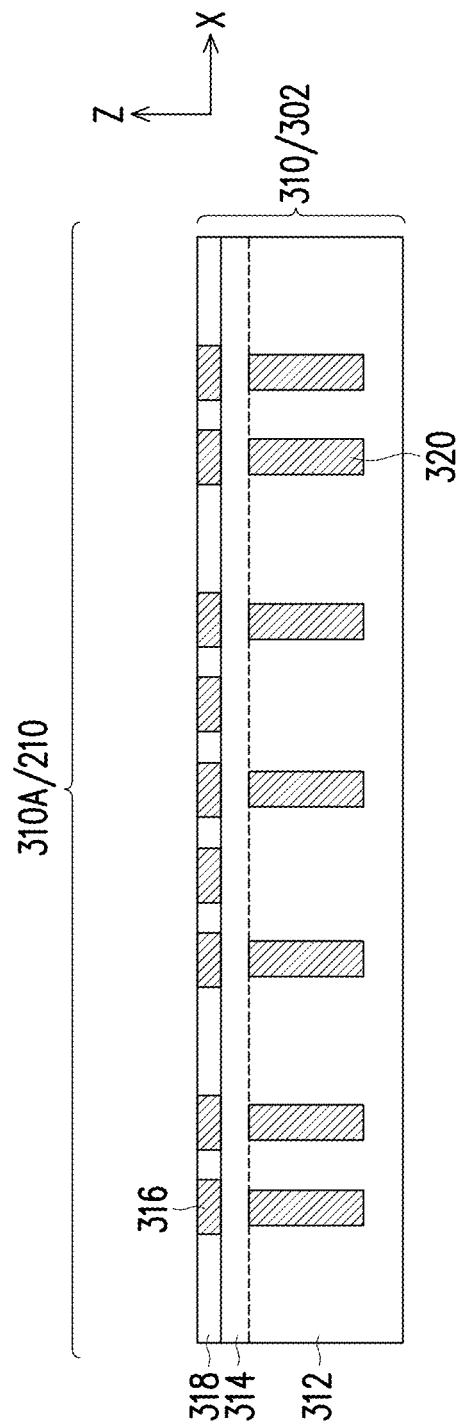
FIGS. 28-33 are views of intermediate stages in the manufacturing of integrated circuit packages, in accordance with some other embodiments.

In FIG. 28, a wafer 310 is obtained or formed. The wafer 310 comprises devices in a package region 310A, which will be singulated in subsequent processing to be included in the package component 210. The devices in the wafer 310 may be interposers, integrated circuit dies, or the like. In some embodiments, interposers 302 are formed in the wafer 310, which include a substrate 312, an interconnect structure 314, and conductive vias 320.

The substrate 312 may be a bulk semiconductor substrate, a semiconductor-on-insulator (SOI) substrate, a multi-layered semiconductor substrate, or the like. The substrate 312 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 312 may be doped or undoped. In embodiments where interposers are formed in the wafer 310, the substrate 312 generally does not include active devices therein, although the interposers may include passive devices formed in and/or on a front surface (e.g., the surface facing upward in FIG. 28) of the substrate 312. In embodiments where integrated circuit devices are formed in the wafer 310, active devices such as transistors, capacitors, resistors, diodes, and the like, may be formed in and/or on the front surface of the substrate 312.

The interconnect structure 314 is over the front surface of the substrate 312, and is used to electrically connect the devices (if any) of the substrate 312. The interconnect structure 314 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect any devices together and/or to an external device. The metallization layer(s) may be formed of a conductive material, such as a metal, such as copper, cobalt, aluminum, gold, combinations thereof, or the like. The interconnect structure 314 may be formed by a damascene process, such as a single damascene process, a dual damascene process, or the like.

In some embodiments, die connectors 316 and a dielectric layer 318 are at the front-side of the wafer 310. Specifically, the wafer 310 may include die connectors 316 and a dielectric layer 318 that are similar to those of the integrated circuit die 50 described for FIG. 1. For example, the die connectors 316 and the dielectric layer 318 may be part of an upper metallization layer of the interconnect structure 314.

The conductive vias 320 extend into the interconnect structure 314 and/or the substrate 312. The conductive vias 320 are electrically connected to metallization layer(s) of the interconnect structure 314. The conductive vias 320 are also sometimes referred to as TSVs. As an example to form the conductive vias 320, recesses can be formed in the interconnect structure 314 and/or the substrate 312 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 314 or the substrate 312 by, for example, a CMP. Remaining portions of the barrier layer and conductive material form the conductive vias 320.

Figure 29:
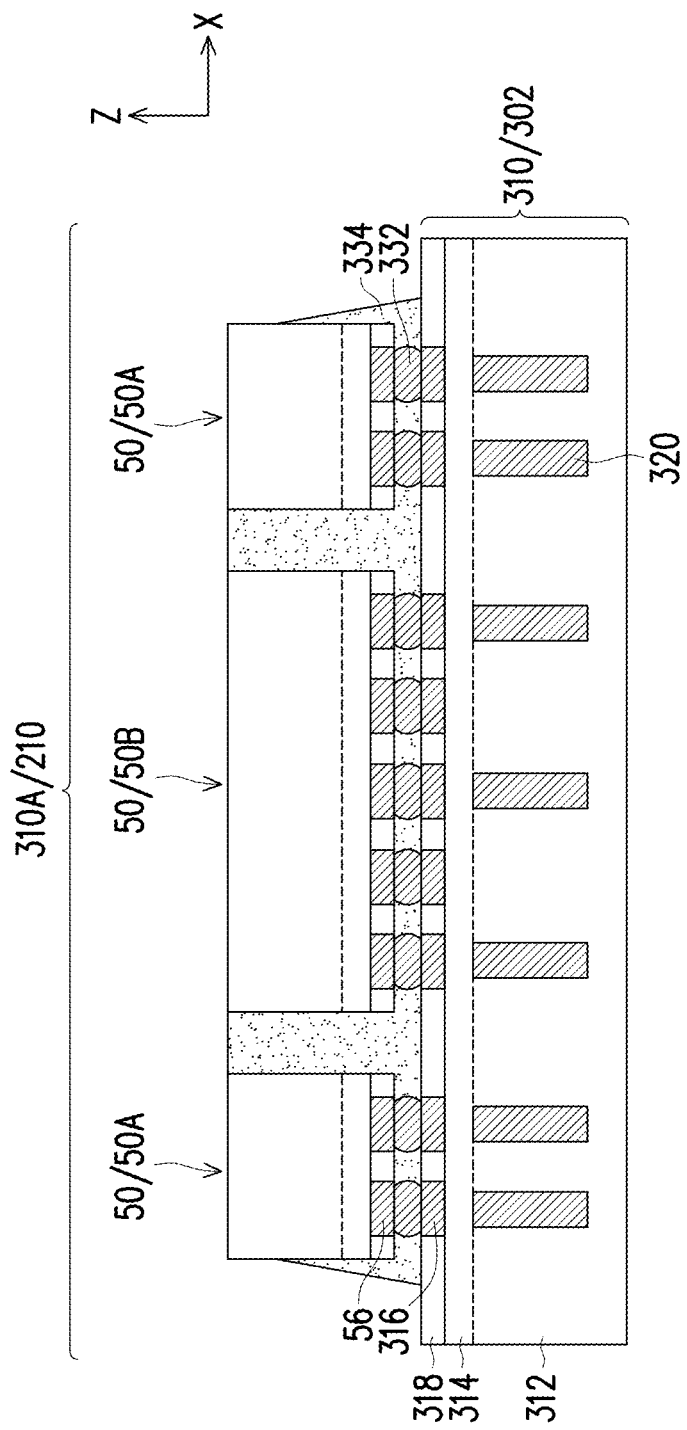

In FIG. 29, integrated circuit dies 50 (e.g., a first integrated circuit die 50A and a plurality of second integrated circuit dies 50B) are attached to the wafer 310. In the embodiment shown, multiple integrated circuit dies 50 are placed adjacent one another, including the first integrated circuit die 50A and the second integrated circuit dies 50B, where the first integrated circuit die 50A is between the second integrated circuit dies 50B. In some embodiments, the first integrated circuit die 50A is a logic device, such as a CPU, GPU, or the like, and the second integrated circuit dies 50B are memory devices, such as DRAM dies, HMC modules, HBM modules, or the like. In some embodiments, the first integrated circuit die 50A is the same type of device (e.g., SoCs) as the second integrated circuit dies 50B.

In the illustrated embodiment, the integrated circuit dies 50 are attached to the wafer 310 with solder bonds, such as with conductive connectors 332. The integrated circuit dies 50 may be placed on the interconnect structure 314 using, e.g., a pick-and-place tool. The conductive connectors 332 may be formed of a conductive material that is reflowable, such as solder, copper, aluminum, gold, nickel, silver, palladium, tin, the like, or a combination thereof. In some embodiments, the conductive connectors 332 are formed by initially forming a layer of solder through methods such as evaporation, electroplating, printing, solder transfer, ball placement, or the like. Once a layer of solder has been formed on the structure, a reflow may be performed in order to shape the conductive connectors 332 into desired bump shapes. Attaching the integrated circuit dies 50 to the wafer 310 may include placing the integrated circuit dies 50 on the wafer 310 and reflowing the conductive connectors 332. The conductive connectors 332 form joints between corresponding die connectors 316 of the wafer 310 and die connectors 56 the integrated circuit dies 50, electrically connecting the interposer 302 to the integrated circuit dies 50.

An underfill 334 may be formed around the conductive connectors 332, and between the wafer 310 and the integrated circuit dies 50. The underfill 334 may reduce stress and protect the joints resulting from the reflowing of the conductive connectors 332. The underfill 334 may be formed of an underfill material such as a molding compound, epoxy, or the like. The underfill 334 may be formed by a capillary flow process after the integrated circuit dies 50 are attached to the wafer 310, or may be formed by a suitable deposition method before the integrated circuit dies 50 are attached to the wafer 310. The underfill 334 may be applied in liquid or semi-liquid form and then subsequently cured.

In other embodiments (not separately illustrated), the integrated circuit dies 50 are attached to the wafer 310 with direct bonds. For example, hybrid bonding, fusion bonding, dielectric bonding, metal bonding, or the like may be used to directly bond corresponding dielectric layers 58, 318 and/or die connectors 56, 316 of the integrated circuit dies 50 and the wafer 310 without the use of adhesive or solder. The underfill 334 may be omitted when direct bonding is used. Further, a mix of bonding techniques could be used, e.g., some integrated circuit dies 50 could be attached to the wafer 310 by solder bonds, and other integrated circuit dies 50 could be attached to the wafer 310 by direct bonds.

Figure 30:
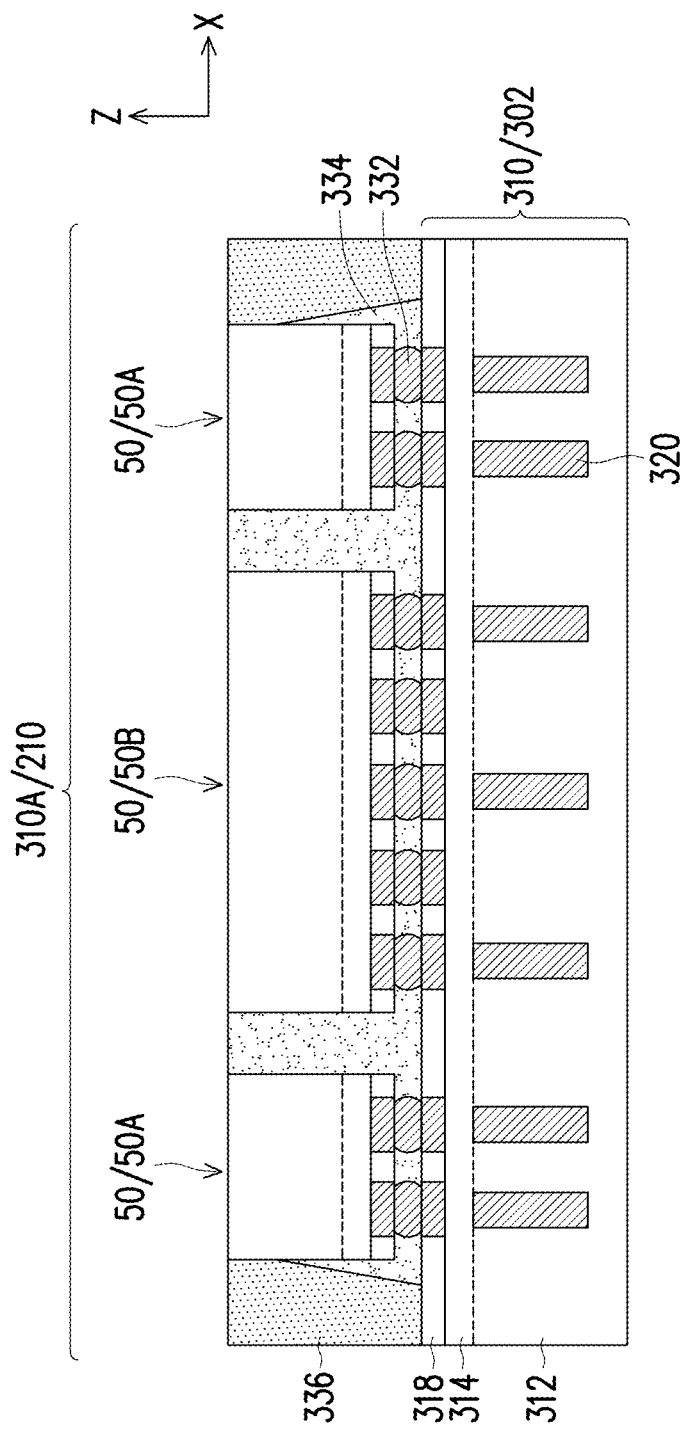

In FIG. 30, an encapsulant 336 is formed on and around the integrated circuit dies 50. After formation, the encapsulant 336 encapsulates the integrated circuit dies 50, and the underfill 334 (if present) or the conductive connectors 332. The encapsulant 336 may be a molding compound, epoxy, or the like. The encapsulant 336 may be applied by compression molding, transfer molding, or the like, and is formed over the wafer 310 such that the integrated circuit dies 50 are buried or covered. The encapsulant 336 may be applied in liquid or semi-liquid form and then subsequently cured. The encapsulant 336 may be thinned to expose the integrated circuit dies 50. The thinning process may be a grinding process, a chemical-mechanical polish (CMP), an etch-back, combinations thereof, or the like. After the thinning process, the top surfaces of the integrated circuit dies 50 and the encapsulant 336 are coplanar (within process variations) such that they are level with one another. The thinning is performed until a desired amount of the integrated circuit dies 50 and/or the encapsulant 336 has been removed.

Figure 31:
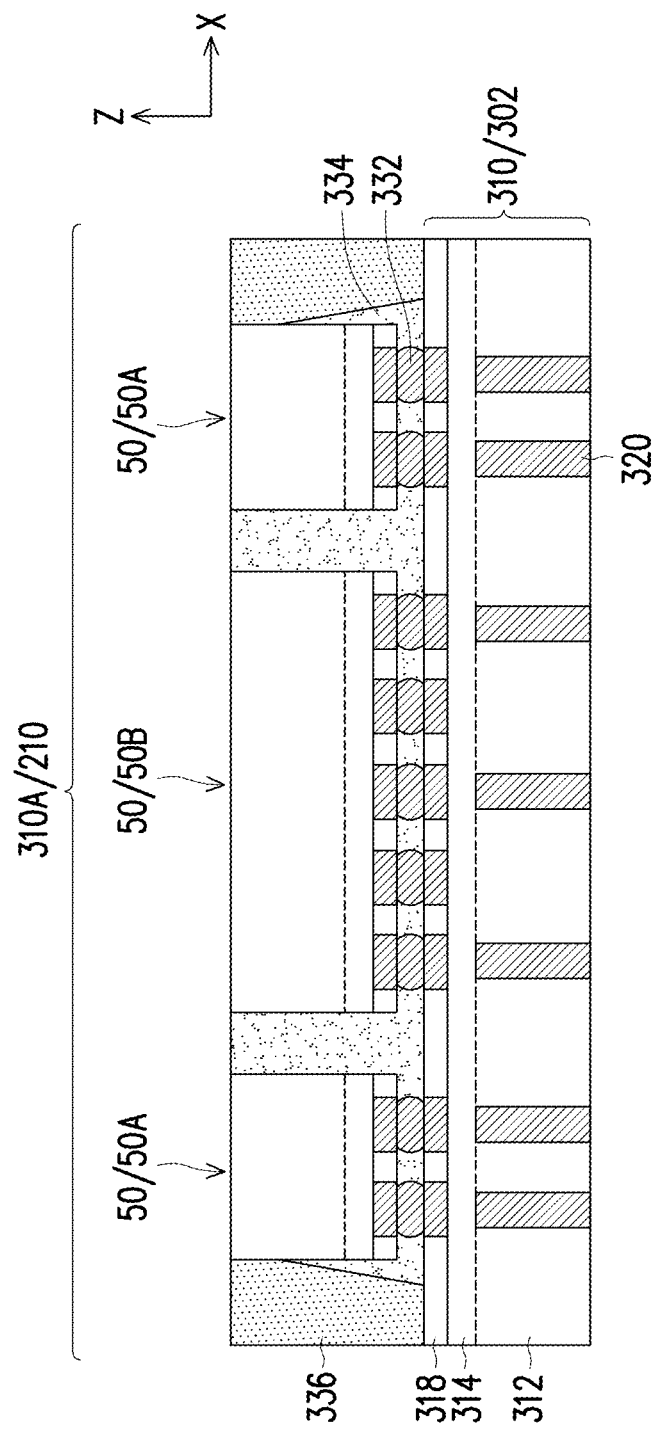

In FIG. 31, the substrate 312 is thinned to expose the conductive vias 320. Exposure of the conductive vias 320 may be accomplished by a thinning process, such as a grinding process, a chemical-mechanical polish (CMP), an etch-back, combinations thereof, or the like. In some embodiments (not separately illustrated), the thinning process for exposing the conductive vias 320 includes a CMP, and the conductive vias 320 protrude at the back-side of the wafer 310 as a result of dishing that occurs during the CMP. In such embodiments, an insulating layer (not separately illustrated) may optionally be formed on the back surface of the substrate 312, surrounding the protruding portions of the conductive vias 320. The insulating layer may be formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. After the substrate 312 is thinned, the exposed surfaces of the conductive vias 320 and the insulating layer (if present) or the substrate 312 are coplanar (within process variations) such that they are level with one another, and are exposed at the back-side of the wafer 310.

Figure 32:
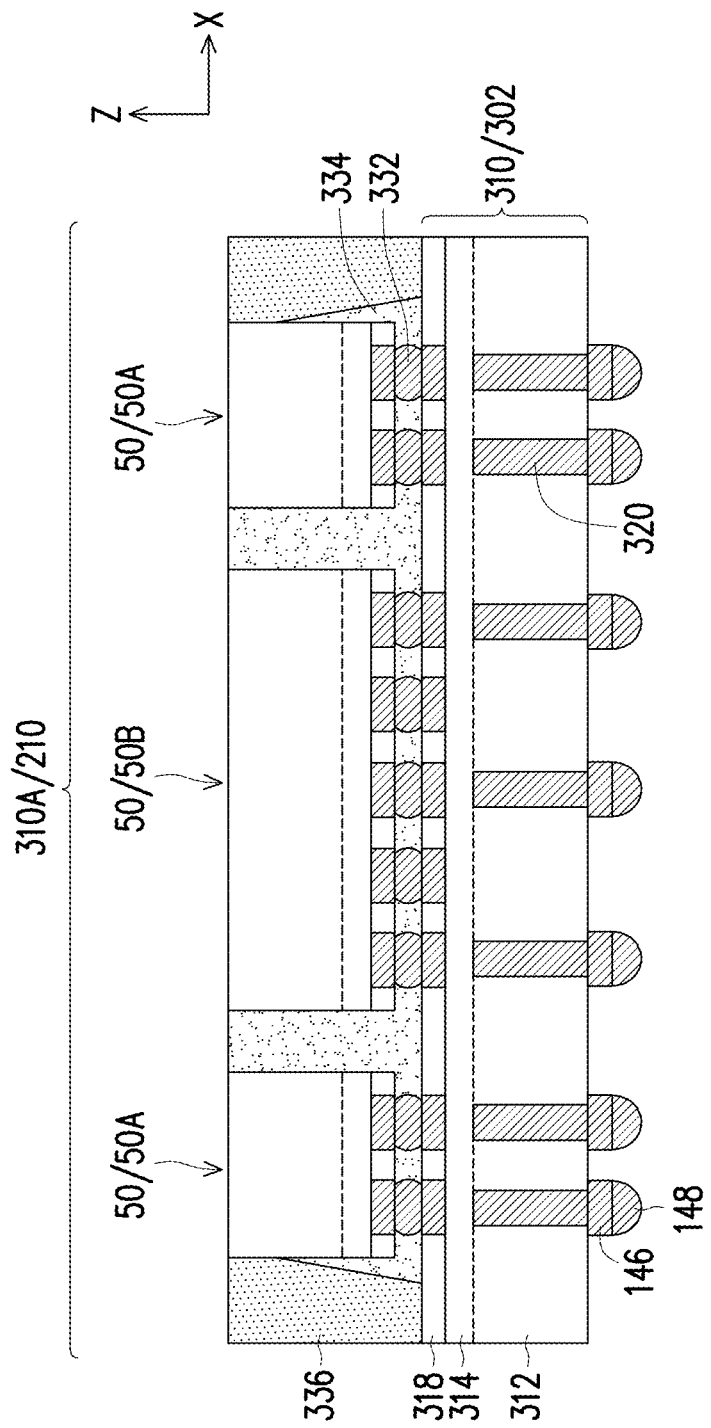

In FIG. 32, UBMs 146 are formed on the exposed surfaces of the conductive vias 320 and the substrate 312. As an example to form the UBMs 146 in this embodiment, a seed layer (not separately illustrated) is formed over the exposed surfaces of the conductive vias 320 and the substrate 312. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 146. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 146.

Further, conductive connectors 148 are formed on the UBMs 146. The conductive connectors 148 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 148 may include a conductive material such as solder, copper, aluminum, gold, nickel, silver, palladium, tin, the like, or a combination thereof. In some embodiments, the conductive connectors 148 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 148 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Further, a singulation process is performed by cutting along scribe line regions, e.g., around the package region 310A. The singulation process may include sawing, dicing, or the like. For example, the singulation process can include sawing the encapsulant 336, the interconnect structure 314, and the substrate 312. The singulation process singulates the package region 310A from adjacent package regions. The resulting, singulated package component 210 is from the package region 310A. The singulation process forms interposers 302 from the singulated portions of the wafer 310. As a result of the singulation process, the outer sidewalls of the interposer 302 and the encapsulant 336 are laterally coterminous (within process variations).

Figure 33:
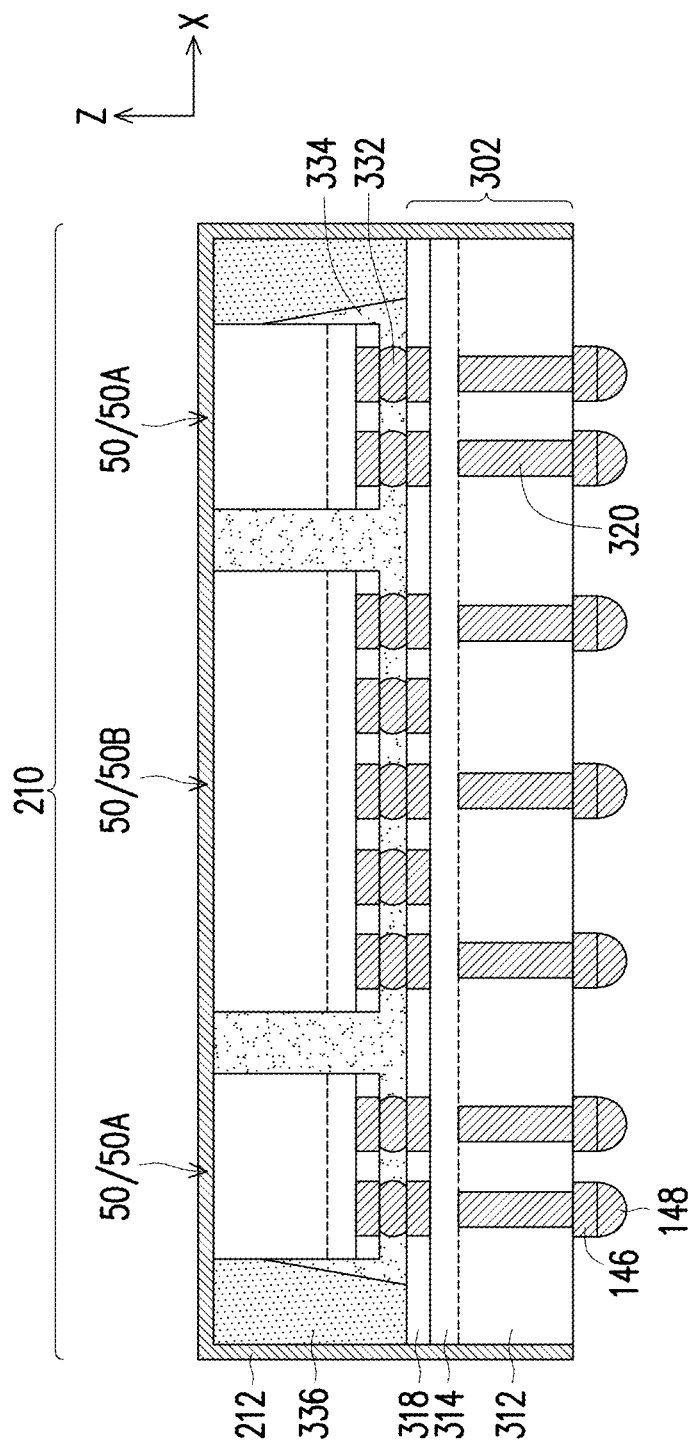

In FIG. 33, heat dissipation structures 212 are formed along the sidewalls, the back-side surfaces, and (optionally) the front-side surfaces of the package component 210. The heat dissipation structures 212 may be formed using similar processes as those previously described for FIGS. 10-12 or for FIGS. 23-25.

Figure 34:
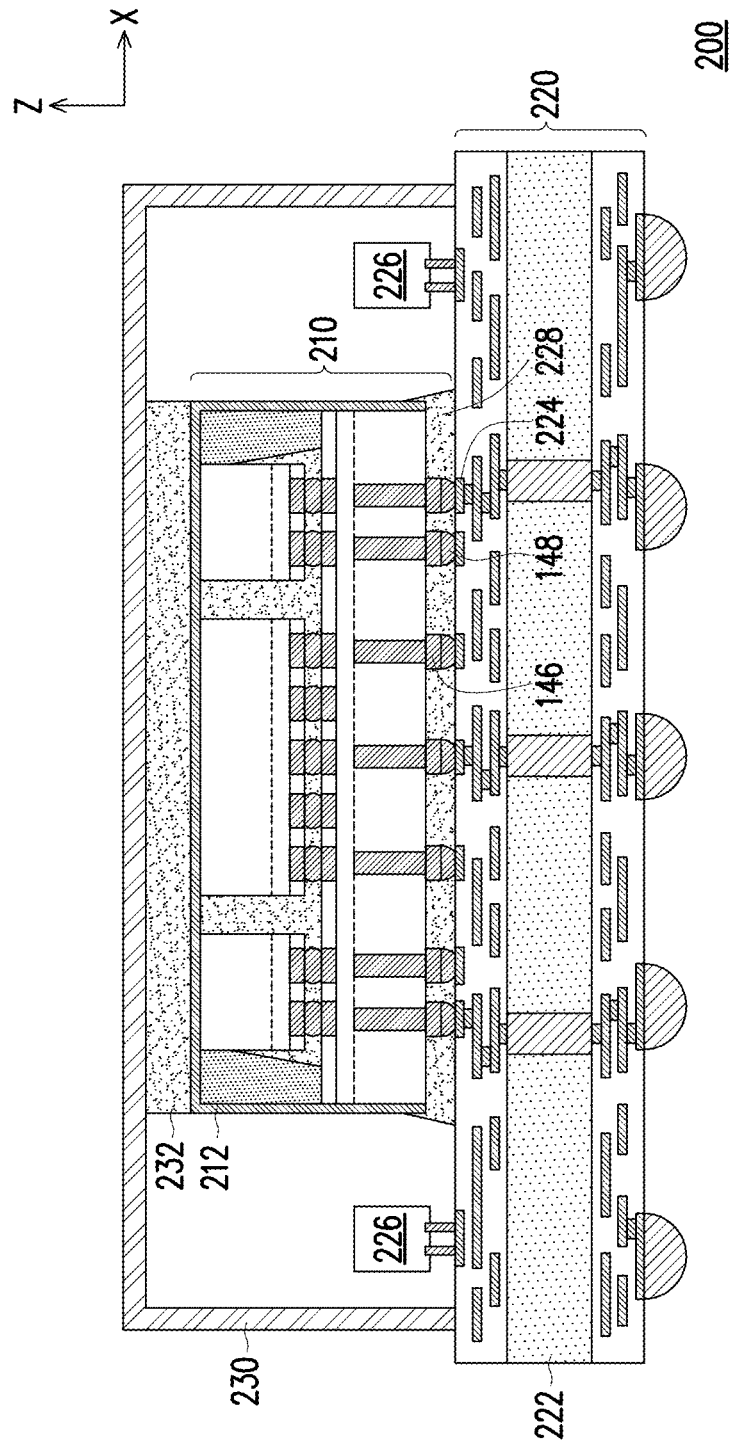
FIG. 34 is a view of an integrated circuit package, in accordance with some other embodiments.

FIG. 34 is a view of an integrated circuit package 200, in accordance with some other embodiments. This embodiment is similar to the embodiment described for FIG. 15, except the package component 210 is similar to that described for FIG. 33. It should be appreciated that any of the integrated circuit packages 200 described for FIGS. 15-21 may have package components 210 similar to that described for FIG. 33.

Embodiments may achieve advantages. Forming the heat dissipation structures 212 after the package components 210 are singulated advantageously allows the heat dissipation structures 212 to be formed on the back-side surfaces, the sidewalls, and (optionally) the front-side surfaces of the package components 210. The heat dissipation structures 212 may thus have a large surface area, improving heat dissipation in the integrated circuit packages 200.

In an embodiment, a device includes: a package component including an integrated circuit die and conductive connectors connected to the integrated circuit die, the conductive connectors disposed at a front-side of the package component, the integrated circuit die exposed at a back-side of the package component; a heat dissipation layer on the back-side of the package component and on sidewalls of the package component; an adhesive layer on a back-side of the heat dissipation layer, a portion of a sidewall of the heat dissipation layer being free from the adhesive layer; and a package substrate connected to the conductive connectors. In some embodiments of the device, the front-side of the package component is free of the heat dissipation layer. In some embodiments of the device, the heat dissipation layer is also on the front-side of the package component. In some embodiments of the device, the heat dissipation layer has a projecting portion extending away from the front-side of the package component. In some embodiments of the device, portions of the heat dissipation layer on the front-side of the package component are planar. In some embodiments of the device, the heat dissipation layer includes aluminum, titanium, titanium nitride, nickel, nickel vanadium, silver, gold, septunseptium, copper, or combinations thereof. In some embodiments, the device further includes: an underfill between the package substrate and the package component, the underfill contacting the heat dissipation layer. In some embodiments of the device, the package component is an integrated fan-out package component. In some embodiments of the device, the package component is a chip-on-wafer package component.

In an embodiment, a device includes: an integrated circuit die; an encapsulant around the integrated circuit die; a redistribution structure on the encapsulant; a heat dissipation layer on a sidewall of the redistribution structure, a sidewall of the encapsulant, a back-side surface of the encapsulant, and a back-side surface of the integrated circuit die; an adhesive layer on a back-side surface of the heat dissipation layer, the adhesive layer different from the heat dissipation layer; and a heat spreader on the adhesive layer. In some embodiments of the device, the heat spreader is a heatsink. In some embodiments, the device further includes: a package substrate connected to the redistribution structure, the heat spreader being a thermal lid attached to the heat dissipation layer and the package substrate. In some embodiments of the device, the heat dissipation layer has a first thickness along the sidewall of the redistribution structure and the sidewall of the encapsulant, the heat dissipation layer has second thickness along the back-side surface of the encapsulant and the back-side surface of the integrated circuit die, and the first thickness is less than or equal to the second thickness. In some embodiments of the device, the heat dissipation layer is also on a front-side surface of the redistribution structure.

In an embodiment, a method includes: packaging an integrated circuit die in a package region of a wafer; singulating the package region from the wafer to form a package component; after singulating the package region, placing the package component on a support structure; depositing a heat dissipation layer on the support structure, on a back-side of the package component, and on sidewalls of the package component; lifting the package component from the support structure; and connecting the package component to a package substrate. In some embodiments of the method, the support structure is a tray, the package component is placed in a recess of the tray, and the package component is lifted out of the recess of the tray. In some embodiments of the method, the tray includes standoffs at a bottom of the recess, the package component is placed on the standoffs, and the heat dissipation layer is deposited on outer sidewalls of the standoffs. In some embodiments of the method, the support structure is a tape, the package component is placed on the tape, and the package component is lifted off the tape. In some embodiments of the method, the package component includes conductive connectors, the conductive connectors pressed into the tape, and the method further includes: after lifting the package component off the tape, cleaning the conductive connectors. In some embodiments, the method further includes: dispensing an adhesive layer on a top surface and a sidewall of the heat dissipation layer; and pressing a heat spreader on the adhesive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a package component comprising an integrated circuit die and conductive connectors connected to the integrated circuit die, the conductive connectors disposed at a front-side of the package component, the integrated circuit die exposed at a back-side of the package component;
   a heat dissipation layer on the back-side of the package component and on sidewalls of the package component;
   an adhesive layer on a back-side of the heat dissipation layer, the adhesive layer further disposed on a first portion of a sidewall of the heat dissipation layer, a second portion of the sidewall of the heat dissipation layer being free from the adhesive layer; and
   a package substrate comprising bond pads in contact with the conductive connectors, the package substrate being separated from the heat dissipation layer.

2. The device of claim 1, wherein the front-side of the package component is free of the heat dissipation layer.

3. The device of claim 1, wherein the heat dissipation layer is also on the front-side of the package component.

4. The device of claim 3, wherein the heat dissipation layer has a projecting portion extending away from the front-side of the package component.

5. The device of claim 3, wherein portions of the heat dissipation layer on the front-side of the package component are planar.

6. The device of claim 1, wherein the heat dissipation layer comprises aluminum, titanium, titanium nitride, nickel, nickel vanadium, silver, gold, septunseptium, copper, or combinations thereof.

7. The device of claim 1 further comprising:
   an underfill between the package substrate and the package component, the underfill contacting the heat dissipation layer.

8. The device of claim 1, wherein the package component is an integrated fan-out package component.

9. The device of claim 1, wherein the package component is a chip-on-wafer package component.

10. A device comprising:
    an integrated circuit die;
    an encapsulant around the integrated circuit die;
    a redistribution structure on the encapsulant, the redistribution structure comprising dielectric layers and redistribution lines among the dielectric layers;
    a heat dissipation layer extending continuously along a front-side surface of the redistribution structure, a sidewall of the dielectric layers of the redistribution structure, a sidewall of the encapsulant, a back-side surface of the encapsulant, and a back-side surface of the integrated circuit die;
    an adhesive layer on a back-side surface of the heat dissipation layer, the adhesive layer different from the heat dissipation layer; and
    a heat spreader on the adhesive layer.

11. The device of claim 10, wherein the heat spreader is a heatsink.

12. The device of claim 10 further comprising:
    a package substrate connected to the redistribution structure, the heat spreader being a thermal lid attached to the heat dissipation layer and the package substrate.

13. The device of claim 10, wherein the heat dissipation layer has a first thickness along the sidewall of the redistribution structure and the sidewall of the encapsulant, the heat dissipation layer has a second thickness along the back-side surface of the encapsulant and the back-side surface of the integrated circuit die, and the first thickness is less than or equal to the second thickness.

14. A method comprising:
    packaging an integrated circuit die in a package region of a wafer;
    singulating the package region from the wafer to form a package component;
    after singulating the package region, placing the package component on a support structure;
    depositing a heat dissipation layer by conformally sputtering a metal on the support structure, on a front-side of the package component, on a back-side of the package component, and on sidewalls of the package component;
    singulating the heat dissipation layer by lifting the package component from the support structure; and
    connecting the package component to a package substrate.

15. The method of claim 14, wherein the support structure is a tray, the package component is placed in a recess of the tray, and the package component is lifted out of the recess of the tray.

16. The method of claim 15, wherein the tray comprises standoffs at a bottom of the recess, the package component is placed on the standoffs, and the heat dissipation layer is deposited on outer sidewalls of the standoffs.

17. The method of claim 14, wherein the support structure is a tape, the package component is placed on the tape, and the package component is lifted off the tape.

18. The method of claim 17, wherein the package component comprises conductive connectors, the conductive connectors being pressed into the tape, the method further comprising:

after lifting the package component off the tape, cleaning the conductive connectors.

19. The method of claim 14, further comprising:

dispensing an adhesive layer on a top surface and a sidewall of the heat dissipation layer; and pressing a heat spreader on the adhesive layer.

20. The device of claim 1, wherein the heat dissipation layer is also on the front-side of the package component, and the heat dissipation layer is a single continuous layer.

\* \* \* \* \*